United States Patent
Hekmatshoar-Tabari et al.

(10) Patent No.: US 9,812,599 B2
(45) Date of Patent: Nov. 7, 2017

(54) METHOD OF STABILIZING HYDROGENATED AMORPHOUS SILICON AND AMORPHOUS HYDROGENATED SILICON ALLOYS

(71) Applicant: International Business Machines Corporation, Armonk, NY (US)

(72) Inventors: Bahman Hekmatshoar-Tabari, Mount Kisco, NY (US); Marinus Hopstaken, Carmel, NY (US); Dae-Gyu Park, Poughquaq, NY (US); Devendra K. Sadana, Pleasantville, NY (US); Ghavam G. Shahidi, Round Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 14/816,726

(22) Filed: Aug. 3, 2015

(65) Prior Publication Data

US 2015/0340532 A1    Nov. 26, 2015

Related U.S. Application Data

(63) Continuation of application No. 13/605,068, filed on Sep. 6, 2012, now Pat. No. 9,099,585, which is a
(Continued)

(51) Int. Cl.
*H01L 31/00* (2006.01)
*H01L 31/0376* (2006.01)
(Continued)

(52) U.S. Cl.
CPC .. *H01L 31/03762* (2013.01); *H01L 31/02167* (2013.01); *H01L 31/075* (2013.01);
(Continued)

(58) Field of Classification Search
CPC .................................................. H01L 31/03762
See application file for complete search history.

(56) References Cited

U.S. PATENT DOCUMENTS

| | | |
|---|---|---|
| 5,248,348 A | 9/1993 | Miyachi et al. |
| 5,646,050 A | 7/1997 | Li et al. |

(Continued)

OTHER PUBLICATIONS

Darwiche et al., "Effects of hydrogen plasma on passivation and generation of defects in multicrystalline silicon," Solar Energy Materials & Solar Cells 91, 2007, pp. 195-200.
(Continued)

*Primary Examiner* — Robert Vetere
(74) *Attorney, Agent, or Firm* — Scully, Scott, Murphy & Presser, P.C.; Louis J. Percello, Esq.

(57) ABSTRACT

A method of forming a semiconductor material of a photovoltaic device that includes providing a surface of a hydrogenated amorphous silicon containing material, and annealing the hydrogenated amorphous silicon containing material in a deuterium containing atmosphere. Deuterium from the deuterium-containing atmosphere is introduced to the lattice of the hydrogenated amorphous silicon containing material through the surface of the hydrogenated amorphous silicon containing material. In some embodiments, the deuterium that is introduced to the lattice of the hydrogenated amorphous silicon containing material increases the stability of the hydrogenated amorphous silicon containing material.

15 Claims, 7 Drawing Sheets

Related U.S. Application Data continuation of application No. 13/188,214, filed on Jul. 21, 2011, now Pat. No. 8,778,448.

(51) Int. Cl.
*H01L 31/0216* (2014.01)
*H01L 31/075* (2012.01)
*H01L 31/18* (2006.01)
*H01L 31/20* (2006.01)

(52) U.S. Cl.
CPC ........ *H01L 31/1864* (2013.01); *H01L 31/202* (2013.01); *Y02E 10/548* (2013.01); *Y02P 70/521* (2015.11)

(56) References Cited

U.S. PATENT DOCUMENTS

| | | | |
|---|---|---|---|
| 5,834,796 | A | 11/1998 | Matsuda et al. |
| 5,872,387 | A | 2/1999 | Lyding et al. |
| 6,524,918 | B2 | 2/2003 | Park et al. |
| 6,833,306 | B2 | 12/2004 | Lyding et al. |
| 7,462,552 | B2 | 12/2008 | Tong et al. |
| 7,649,201 | B2 | 1/2010 | Mouli |
| 2006/0175641 | A1* | 8/2006 | Mouli ............... H01L 27/14603 257/292 |
| 2008/0000521 | A1* | 1/2008 | Sivoththaman ......... C30B 25/02 136/254 |
| 2008/0251116 | A1* | 10/2008 | Green .................... B82Y 10/00 136/255 |
| 2009/0308450 | A1* | 12/2009 | Adibi .................... H01L 21/266 136/256 |
| 2010/0147361 | A1* | 6/2010 | Chen .................... H01L 31/0322 136/249 |
| 2010/0218821 | A1* | 9/2010 | Kim ................ H01L 31/022441 136/256 |

OTHER PUBLICATIONS

Hoffmann, M., "Stack System of PECVD Amorphous Silicon and PECVD Silicon Oxice for Silicon Solar Cell Rear Side Passivation", Prog. Photovolt. Res. Appl. 2008, 16: 509-518 (published online Jun. 17, 2008 in Wiley InterScience.

Sidhu, L. S., et al. "Infrared vibration spectra of hydrogenated, deuterated, and tritiated amorphous silicon", Journal of Applied Physics, Mar. 1999, vol. 85, No. 5, pp. 2574-2578.

\* cited by examiner

METHOD OF STABILIZING HYDROGENATED AMORPHOUS SILICON AND AMORPHOUS HYDROGENATED SILICON ALLOYS

BACKGROUND

The present disclosure relates to hydrogenated amorphous silicon (α-Si:H) and alloys thereof. The present disclosure further relates to photovoltaic devices, such as solar cells, including hydrogenated amorphous silicon incorporated therein. Hydrogenated amorphous silicon can be employed in the production of solar cells and transistor devices. Examples are p-i-n solar cells as stand-alone devices or components of multi-junction (tandem) cells, and heterojunction solar cells with single-crystalline Si (c-Si) absorption layers. Other examples of structures that utilize hydrogenated amorphous silicon include the passivation layers to photovoltaic cells, and thin-film transistors for displays and X-ray imagers. Further, hydrogenated amorphous silicon alloys, such as hydrogenated amorphous silicon germanium and hydrogenated amorphous silicon carbide, are also used in p-i-n solar cells and heterojunction solar cells.

BRIEF SUMMARY

In one embodiment, a method of forming hydrogenated amorphous silicon (α-Si:H) and/or α-Si:H alloys is provided that introduces deuterium (D) into the lattice of the α-Si:H and/or α-Si:H alloy to replace at least one silicon-hydrogen (Si—H) bond with at least one silicon-deuterium (Si-D) bond. In some embodiments, by replacing the at least one silicon-hydrogen (Si—H) bond, with at least one silicon-deuterium (Si-D) bond, the stability of the hydrogenated amorphous silicon (α-Si:H) and/or α-Si:H alloy can be increased. In one embodiment, the method includes providing a surface of a hydrogenated amorphous silicon (α-Si:H) containing material, and annealing the hydrogenated amorphous silicon (α-Si:H) containing material in a deuterium containing atmosphere, wherein the deuterium is introduced to the lattice of the hydrogenated amorphous silicon (α-Si:H) containing material.

In another aspect of the present disclosure, a photovoltaic device is provided that includes a hydrogenated amorphous silicon and deuterium containing material. In one embodiment, the hydrogenated amorphous silicon and deuterium containing material includes greater than 80 atomic percent (at. %) silicon, greater than 5 at. % hydrogen and greater than 0.001 at. % deuterium. In one embodiment, deuterium can bond with dangling silicon bonds to increase the stability of the hydrogenated amorphous silicon and deuterium containing material in comparison to a hydrogenated amorphous silicon that does not contain deuterium.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
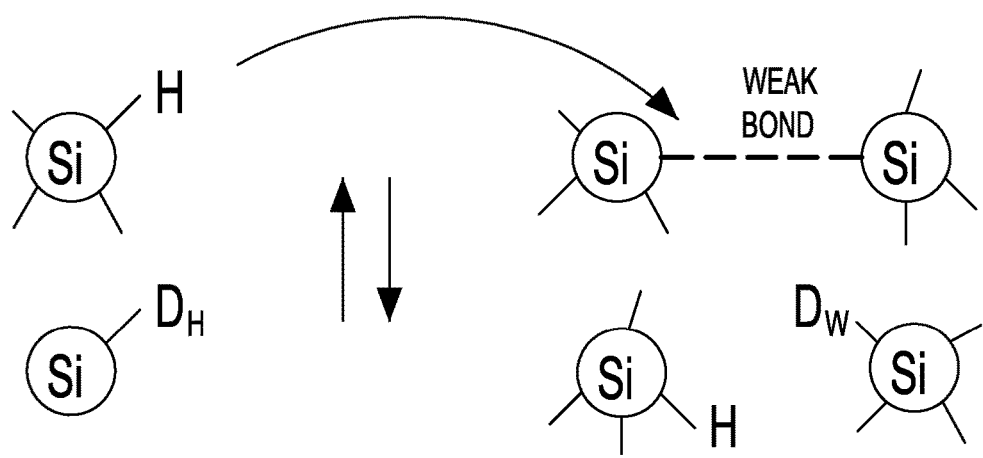
FIG. 1 is a pictorial representation illustrating a hydrogen mediated weak bond model.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present disclosure relates to hydrogenated amorphous silicon (α-Si:H) and alloys thereof, and photovoltaic devices, such as solar cells, including hydrogenated amorphous silicon that is incorporated therein. One of the long-standing issues common to hydrogenated amorphous silicon devices, is the metastability of hydrogenated amorphous silicon. Metastability refers to reversible changes in the material's properties driven by temperature change or an external excitation, such as light or bias, that shifts the position of the Fermi level (chemical potential) in the material. Generally, metastability is not a desired phenomenon, as metastable changes translate into the degradation of the device properties over the course of operation time. One example of the metastable phenomena is the degradation of hydrogenated amorphous silicon solar cell efficiency during operation (under sunlight), known as the Staebler-Wronski effect, and the shift of the hydrogenated amorphous silicon thin film transistor (TFT) threshold voltage during operation (under gate voltage bias). Other phenomena that may result from the metastable properties of hydrogenated amorphous silicon include defect generation induced by space-charge limited currents, metastable changes in doping efficiency, and the degradation of hydrogenated amorphous silicon passivation on crystalline silicon (c-Si) during illumination.

In at least some instances, the source of metastability in hydrogenated amorphous silicon is the reversible conversion of weak (strained) silicon-silicon bonds into dangling bonds, which may be referred to as the weak-bond model. The metastability of hydrogenated amorphous silicon may be linked to the dispersive diffusion of hydrogen, in which (i) hydrogen may be released from a silicon-hydrogen bond, (ii) diffuse to an adjacent weak silicon-silicon bond, and (iii) create dangling bonds by breaking the weak silicon-silicon bond. FIG. 1 illustrates a hydrogen-mediated weak bond model, in which a hydrogen atom moves from a silicon-hydrogen bond and breaks a weak silicon-silicon bond, leaving two defects $D_H$ and $D_W$.

In one aspect, the present disclosure provides a method of improving the stability of hydrogenated amorphous silicon by introducing deuterium (D) into the hydrogenated amorphous silicon lattice to replace some of the silicon-hydrogen bonds with silicon-deuterium (Si-D) bonds. As a result, metastability is suppressed due to: (i) stronger silicon-deutermium bonds compared to silicon hydrogen bonds and/or (ii) lower diffusivity of deuterium compared to hydrogen. In one embodiment, the method of improving the stability of hydrogenated amorphous silicon photovoltaic materials includes providing a surface of a hydrogenated amorphous silicon containing material, and annealing the hydrogenated amorphous silicon containing material in a deuterium containing atmosphere, wherein the deuterium is introduced to the lattice of the hydrogenated amorphous silicon containing material. By introducing the deuterium to the lattice of the hydrogenated amorphous silicon containing material, a hydrogenated amorphous silicon and deuterium containing material is provided, in which the deuterium bonds with dangling silicon bonds to increase the stability of the hydrogenated amorphous silicon and deuterium containing material in comparison to a hydrogenated amorphous silicon that does not contain deuterium. By "increase the stability" it is meant that the rate of bond breaking in hydrogenated amorphous silicon is reduced and as a result the metastability phenomena described above is suppressed. In one embodiment where hydrogenated amorphous Si is used to passivate the surface of a single-crystalline or multi-crystalline semiconductor, such as Si, Ge, SiGe or GaAs, the consequence of the suppressed metastability is the reduction of the metastable changes of the effective carrier lifetime in the above-mentioned crystalline or multi-crystalline material that is passivated with hydrogenated amorphous silicon and deuterium containing material compared to that of a similar material passivated with hydrogenated amorphous silicon that does not contain deuterium. The effective carrier lifetime in the crystalline or multi-crystalline semiconductor material depends on the carrier lifetime in the bulk of the crystalline or multi-crystalline semiconductor material and the surface recombination velocity of the carriers at the surface of the crystalline or multi-crystalline semiconductor material (i.e. at the interface with the hydrogenated amorphous Si). The surface recombination velocity at an interface is proportional to the carrier recombination rate at that interface. Therefore, the reduction of the metastable changes of the effective carrier lifetime in crystalline or multi-crystalline materials pas sivated with deuterium-containing hydrogenated amorphous Si containing material indicates a reduction in the metastable changes of the carrier recombination rate at the interface between the crystalline or multi-crystalline material and deuterium-containing hydrogenated amorphous Si containing material compared to the case of hydrogenated amorphous Si containing material which does not contain deuterium. The term "amorphous" as used to describe the hydrogenated amorphous silicon and deuterium containing material denotes that the hydrogenated silicon lattice lacks a long range order. The term "hydrogenated" denotes that the intrinsic amorphous hydrogenated silicon contains hydrogen. The hydrogen content of hydrogenated amorphous silicon is typically larger than 5 at. % with hydrogen content of about 10 at. % being the most typical. By "deuterium containing" it is meant that the hydrogenated amorphous silicon includes deuterium, with typical deuterium contents larger than 1 at. %. Throughout this disclosure, the usage of the term "hydrogenated amorphous silicon" covers the possibility that the film may contain a crystalline portion. This also applies to hydrogenated amorphous silicon containing materials such as hydrogenated amorphous silicon germanium and hydrogenated amorphous silicon carbide.

Figure 2:
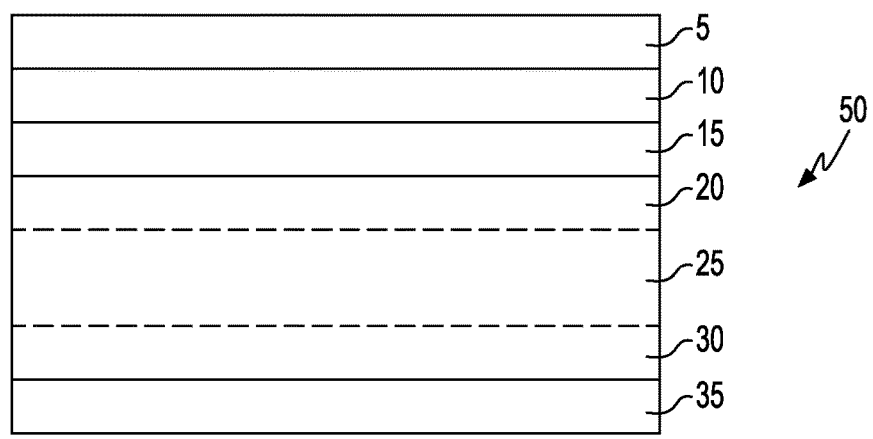
FIG. 2 is a side cross-sectional view of a photovoltaic device including a single junction p-i-n solar cell, wherein at least one material layer of the photovoltaic device is composed of a hydrogenated amorphous silicon and deuterium containing material, in accordance with one embodiment of the present disclosure.

FIG. 2 depicts one embodiment of a photovoltaic device 50, in which at least a portion of the photovoltaic device 50 includes a hydrogenated amorphous silicon and deuterium containing material. As used herein, a "photovoltaic device" is a device, such as a solar cell, that produces free electrons-hole pairs, when exposed to radiation, such as light, and results in the production of an electric current. The photovoltaic device typically includes layers of p-type conductivity and n-type conductivity that share an interface to provide a junction.

The embodiment that is depicted in FIG. 2 is a single junction solar cell composed of amorphous or microcrystalline silicon (Si) and its basic electronic structure is a p-i-n junction. The p-i-n junction includes a p-type conductivity semiconductor layer 20, an intrinsic semiconductor layer 25 and an n-type semiconductor layer 30. An "intrinsic semiconductor layer" is a layer of semiconductor material that is substantially pure, i.e., the intrinsic semiconductor layer is not doped with n-type or p-type dopants. As used herein, "p-type" refers to the addition of impurities to an intrinsic semiconductor that creates deficiencies of valence electrons (i.e. holes). In operation, the p-i-n junction provides an electric field in response to an irradiated material. As negative charge accumulates in the p-type conductive semiconductor layer 20 and part of the intrinsic layer on the p-type side (due to ionized acceptor impurities or positively charged defects), and positive charge accumulates in the n-type conductivity semiconductor layer 30 and part of the intrinsic layer on the n-type side (due to ionized donor impurities or negatively charged defects), an electric field is generated from the direction of the n-type conductivity semiconductor layer 30 towards the p-type conductivity semiconductor layer 20. Electrons in the intrinsic semiconductor layer 25 drift towards the n-type conductivity semiconductor layer 30 due to the electric field, and holes in the intrinsic semiconductor layer 25 drift towards the p-type conductivity semiconductor layer 20. Thus, the electron-hole pairs are collected systematically to provide positive charges at the p-type conductivity semiconductor layer 20 and negative charges at the n-type conductivity semiconductor layer 30. The p-i-n junction forms the core of this type of photovoltaic device, which provides electromotive force that can power a device.

Typically, a p-i-n structure is usually used, as opposed to an n-i-p structure. This is because, the mobility of electrons in hydrogenated amorphous silicon may be one to two orders of magnitude larger than that of holes, and thus the collection rate of electrons moving from the p-type conductivity semiconductor layer 20 to the n-type conductivity semiconductor layer 30 contact is better than holes moving from the p-type conductivity semiconductor layer 20 to n-type conductivity semiconductor layer 30. Therefore, the p-type conductivity semiconductor layer 20 should be placed towards the upper surface of the photovoltaic device where the light intensity is stronger, so that the majority of the charge carriers crossing the junction would be electrons.

Referring to FIG. 2, the photovoltaic device 50 may include a material stack, from top to bottom, of a substrate 5, an oxide containing passivation layer 10, a transparent conductive material layer 15, a p-type conductivity semiconductor layer 20, an intrinsic semiconductor layer 25, an n-type conductivity semiconductor layer 30, and a back contact metallization structure 35. In one embodiment, at least one of the p-type conductivity semiconductor layer 20, the intrinsic semiconductor layer 25, and the n-type conductivity semiconductor layer 30 of the p-i-n junction of the photovoltaic device 50 is provided by a hydrogenated amorphous silicon and deuterium containing material. The material stack depicted in FIG. 2 provides a single junction p-i-n solar cell, the details of which are now discussed in greater detail.

The substrate 5 is a structure that provides mechanical support to the photovoltaic device 50. The substrate 5 is transparent in the range of electromagnetic radiation at which photogeneration of electrons and holes occur within the photovoltaic device 50. In one embodiment, the substrate 5 can be optically transparent, i.e., transparent in the visible electromagnetic spectral range having a wavelength from 400 nm to 800 nm. In one embodiment, the substrate 5 can be a glass substrate. The thickness of the substrate 5 can be from 50 microns to 3 mm, although lesser and greater thicknesses can also be employed.

The transparent conductive material layer 15 includes a material that is transparent in the range of electromagnetic radiation at which photogeneration of electrons and holes occur within the photovoltaic device structure. For example, the transparent conductive material layer 15 can include a transparent conductive oxide (TCO), such as a fluorine-doped tin oxide ($SnO_2$:F), an aluminum-doped zinc oxide (ZnO:Al), or indium tin oxide. The thickness of the transparent conductive material layer 15 can be from 100 nm to 3 microns, although lesser and greater thicknesses can also be employed. In one embodiment, an oxide containing passivation layer 10 is present between the transparent conductive material layer 15 and the substrate 5. The oxide containing passivation layer 10 may be composed of silicon oxide ($SiO_2$), and may have a thickness ranging from 100 nm to 1 micron, although lesser and greater thicknesses can also be employed.

The p-i-n structure may be present beneath the transparent conductive material layer 15, and includes the p-type conductivity semiconductor layer 20, the intrinsic semiconductor layer 25, and the n-type conductivity semiconductor layer 30. At least one layer of the p-i-n structure may be composed of a hydrogenated amorphous silicon and deuterium containing material as provided by the present disclosure. As the hydrogenated amorphous silicon and deuterium containing material has a higher absorption rate of light than crystalline cells, a substantially complete light spectrum can be absorbed with a very thin layer of hydrogenated amorphous silicon and deuterium containing material. For example, the hydrogenated amorphous silicon and deuterium containing material may have a optical energy bandgap of 1.7 eV and have an optical absorption coefficient, a, greater than $10^5$ cm$^{-1}$, for photons with energies greater than the energy band gap. In one embodiment, a film of hydrogenated amorphous silicon and deuterium containing material only 1 micron thick can absorb 90% of the usable solar energy.

Typically, in amorphous p-i-n structures, the hydrogenated amorphous silicon includes 5% to 20% hydrogen, in which the hydrogen passivates the dangling bonds that result from the coordination defects in hydrogenated amorphous Si (i.e., missing or extra Si atoms, with respect to the 4-fold coordinated crystalline structure of Si). The strength of the hydrogen silicon bonds is, however, limited, and hydrogen is of a lightweight mass, which may facilitate the diffusion of the free hydrogen through the silicon lattice to disrupt the hydrogen silicon bonding. If a source of external excitation provides sufficient energy to break a weak Si—Si bond, a hydrogen atom may detach from a Si—H bond, and diffuse towards the broken Si-Si bond to form a new Si—H bond as shown schematically in FIG. 1. This will create a dangling bond at the site of the original Si—H bond (which is now missing the H atom) and another dangling bond at the site of the broken Si—Si bond (note that one of the two Si atoms is not bonded with H). These two dangling bonds are denoted as $D_H$ and $D_W$ in FIG. 1, respectively. Other reactions of the same type are also possible. For instance, the weak bond may be saturated with two hydrogen atoms as a result of hydrogen release from a second Si—H bond. If a H atom is not available at the instant a Si—Si bond breaks, the Si—Si bond will re-form after the excitation is removed (essentially dissipated in the form of heat, i.e. lattice vibration). In the case of illumination in solar cells (Staebler-Wronski effect), the energy required for the breaking of weak Si—Si bond is primarily provided by the energy released from the recombination of photo-generated electron-hole pairs. In case of gate-voltage bias in thin-film transistors, the energy required for the breaking of weak Si—Si bond is primarily provided by the energy released from the trapping of a field-induced free electron in a dangling bond (coordination defect). Since D-Si bonds are stronger than Si—H bonds and/or the diffusivity of D in the Si lattice is lower than that of H, the probability that a D atom is available to saturate a weak Si—Si bond at the instant the Si—Si bond breaks due to an external excitation (and as a result, the probability of bond-breaking) is lower.

At least one of the p-type conductivity semiconductor layer 20, the intrinsic semiconductor layer 25, and the n-type conductivity semiconductor layer 30 may be composed of the hydrogenated amorphous silicon and deuterium containing material. The hydrogenated amorphous silicon and deuterium containing material used in at least one of the p-type conductivity semiconductor layer 20, the intrinsic semiconductor layer 25, and the n-type conductivity semiconductor layer 30 is composed of greater than 80 at. % silicon, greater than 5 at. % hydrogen and greater than 0.001 at. % deuterium. In one embodiment, deuterium is present in the hydrogenated amorphous silicon and deuterium containing material in an amount ranging from 0.001 at. % to 1 at. %. In one embodiment, hydrogen is present in the hydrogenated amorphous silicon and deuterium containing material in an amount ranging from 5 at. % to 20 at. %. In one embodiment, silicon is present in the hydrogenated amorphous silicon and deuterium containing material in an amount ranging from 80 at. % to 95 at. %.

The dopant that provides the p-type conductivity of the p-type conductivity semiconductor layer 20 may be an element from group III-A of the Periodic Table of Elements. Examples of p-type dopants include, but are not limited to, boron, aluminum, gallium and indium, but it is noted that any impurity that creates deficiencies of valence electrons is suitable for the p-type dopant. In one embodiment, the p-type conductivity semiconductor layer 20 includes a hydrogenated amorphous silicon and deuterium containing material that has a concentration of p-type dopant ranging from $10^{16}$ atoms/cm$^3$ to $10^{21}$ atoms/cm$^3$, and has a thickness that ranges from 1 nm to 50 nm. In another embodiment, the concentration of the p-type dopant in the p-type conductivity semiconductor layer 20 ranges from $10^{18}$ atoms/cm$^3$ to $10^{20}$ atoms/cm$^3$, and has a thickness ranging from 3 nm to 30 nm. The doping efficiency (the ratio of activated dopant atoms, to the total dopant atoms) in layer 20 ranges from 0.1% to 20% although higher and lower doping efficiencies are possible. Typically, the doping efficiency is decreased by increasing the dopant atom concentration. Typically, the band gap of the p-type conductivity semiconductor layer 20 ranges from 1.7 eV to 2.5 eV, although higher and lower bandgaps may be also used. Layer 20 may be composed of a carbon alloy. In some embodiments, layer 20 comprises deuterium-containing p-type hydrogenated amorphous silicon-carbide.

In some embodiments, in which one of the intrinsic semiconductor layer 25, and the n-type conductivity semiconductor layer 30 is composed of the hydrogenated amorphous silicon and deuterium containing material, the p-type conductivity semiconductor layer 20 may be composed of crystalline silicon containing material, e.g., micro-crystalline (c-Si) and/or hydrogenated amorphous silicon that does not include deuterium.

The intrinsic semiconductor layer 25 is not doped with an n-type or p-type dopant. The combination of the p-type conductivity semiconductor layer 20, the intrinsic semiconductor layer 25, and the n-type conductivity semiconductor layer 25 establishes an electric field to separate the electron-hole pairs during the functionality of the solar cell. These layers also determine the voltage of the device. The intrinsic semiconductor layer 25 is the active layer of the device, where most of the solar cell current originates.

The intrinsic semiconductor layer 25 is typically present between and in direct contact with the p-type conductivity semiconductor layer 20 and the n-type conductivity semiconductor layer 30. The thickness of the intrinsic semiconductor layer 30 may depend on the collection length of electrons and holes in the intrinsic hydrogenated semiconductor-containing material. In one embodiment, the intrinsic semiconductor layer 25 is composed of a hydrogenated amorphous silicon and deuterium containing material that has a thickness that ranges from 100 nm to 1 micron. In another embodiment, the intrinsic semiconductor layer 25 is composed of a hydrogenated amorphous silicon and deuterium containing material that has a thickness ranging from 100 nm to 1 micron. Typically, the band gap of the intrinsic semiconductor layer 25 ranges from 1.6 eV to 1.8 eV.

In some embodiments, in which one of the p-type conductivity semiconductor layer 20, and the n-type conductivity semiconductor layer 30 is composed of the hydrogenated amorphous silicon and deuterium containing material, the intrinsic semiconductor layer 25 may be composed of crystalline silicon-containing material, e.g., micro-crystalline (c-Si) and/or a hydrogenated amorphous silicon that does not include deuterium.

The dopant that provides the n-type conductivity of the n-type conductivity semiconductor layer 30 may be an element from group III-A of the Periodic Table of Elements. Examples of n-type dopants include, but are not limited to, antimony, arsenic and phosphorous. It is noted that the aforementioned list of dopants is provided for illustrative purposes only and is not intended to limit the present disclosure, as the n-type dopant may be any impurity that creates free electrons in the intrinsic semiconductor that provides the base material of the n-type conductivity semiconductor layer 30, e.g., hydrogenated amorphous silicon and deuterium containing material. In one embodiment, the n-type conductivity semiconductor layer 30 includes a hydrogenated amorphous silicon and deuterium containing material that has a concentration of n-type dopant ranging from $10^{16}$ atoms/cm$^3$ to $10^{21}$ atoms/cm$^3$, and has a thickness that ranges from 1 nm to 50 nm. In another embodiment, the concentration of the n-type dopant in the n-type conductivity semiconductor layer 30 ranges from $10^{18}$ atoms/cm$^3$ to $10^{20}$ atoms/cm$^3$, and the n-type conductivity semiconductor layer 30 has a thickness ranging from 3 nm to 30 nm. The doping efficiency (the ratio of activated dopant atoms, to the total dopant atoms) in layer 20 ranges from 0.1% to 20% although higher and lower doping efficiencies are possible. Typically, the doping efficiency is decreased by increasing the dopant atom concentration. Typically, the band gap of the n-type conductivity semiconductor layer 30 ranges from 1.6 eV to 1.8 eV, although higher and lower bandgaps are also possible.

In some embodiments, in which at least one of the intrinsic semiconductor layer 25, and the p-type conductivity semiconductor layer 20 are composed of a hydrogenated amorphous silicon and deuterium containing material, the n-type conductivity semiconductor layer 30 may be composed of a crystalline silicon-containing material, e.g., micro-crystalline (c-Si) or the n-type conductivity semiconductor layer 20 is composed of a hydrogenated amorphous silicon that does not include deuterium.

Still referring to FIG. 2, the back contact metallization structure 35 includes a metallic material. The metallic material may have a high reflectivity in the range of electromagnetic radiation at which photogeneration of electrons and holes occurs within the photovoltaic device 50. The metallic material can include silver, aluminum, or an alloy thereof. The thickness of the back contact metallization structure 35 can be from 100 nm to 1 micron, although lesser and greater thicknesses can also be employed. In one embodiment, the back contact metallization structure 35 functions as a negative node of the photovoltaic device, and the transparent conductive material layer 10 may function as a positive node of the photovoltaic device 50. In some embodiments, a bilayer of transparent conductive material and high reflectivity metal such as silver may be used to form layer 35, in order to improve reflectivity. In these embodiments, the transparent conductive material is in direct contact with layer 30, and has a thickness typically in the range of 70 nm to 100 nm. The description of the transparent conductive material is the same as that described for layer 15.

In some embodiments, the method of forming the photovoltaic device 50 depicted in FIG. 2 may begin with forming the transparent conductive material layer 25 on the substrate 5.

The transparent conductive material layer 15 is typically formed using a deposition process, such as sputtering or chemical vapor deposition (CVD). Chemical vapor deposition (CVD) is a deposition process in which a deposited species is formed as a result of a chemical reaction between gaseous reactants at room temperature or greater, wherein solid product of the reaction is deposited on the surface on which a film, coating, or layer of the solid product is to be formed.

Examples of CVD processes suitable for forming the transparent conductive material layer 15 include, but are not limited to, atomic pressure chemical vapor deposition (AP-CVD), low pressure chemical vapor deposition (LPCVD), plasma enhanced chemical vapor deposition (PECVD), metal organic chemical vapor deposition (MOCVD) and combinations thereof. Examples of sputtering are included but not limited to RF and DC magnetron sputtering. In some embodiments, prior to forming the transparent conductive material layer 15, an oxide or nitride containing passivation layer 10 is formed on the substrate 5. The oxide containing passivation layer 10 may be formed using thermal growth methods, such as thermal oxidation, or deposition, such as CVD. The nitride containing layer is typically deposited by CVD. In one embodiment, the oxide or nitride containing passivation layer 10 may increase adhesion between the substrate 5 and the transparent conductive material layer 15.

The p-i-n junction of the solar cell may be formed following the transparent conductive material layer 15. More specifically, and in one embodiment, the n-type conductivity semiconductor layer 20, intrinsic semiconductor layer 25, and the p-type conductivity semiconductor layer 35 may be sequentially deposited to provide the p-i-n junction, following the formation of the transparent conductive material layer 15. At least one of the n-type conductivity semiconductor layer 20, the intrinsic semiconductor layer 25, and the p-type conductivity semiconductor layer 30 is composed of a hydrogenated amorphous silicon and/or hydrogenated amorphous silicon alloy that includes deuterium (D), which is also referred to as the "hydrogenated amorphous silicon and deuterium containing material. In one embodiment, the hydrogenated amorphous silicon and deuterium containing material is formed by providing a surface of a hydrogenated amorphous silicon containing material, and annealing the hydrogenated amorphous silicon containing material in a deuterium containing atmosphere, wherein the deuterium is introduced to the lattice of the hydrogenated amorphous silicon containing material.

The hydrogenated amorphous silicon containing material prior to treatment with the deuterium containing atmosphere may include up to 20% hydrogen, but does not include deuterium. In one embodiment, the hydrogenated amorphous silicon is deposited using plasma-enhanced chemical vapor deposition process (PECVD). PECVD is a chemical vapor deposition process that uses electrical energy to generate a plasma, e.g., glow discharge plasma. The plasma may be created by RF (AC) frequency, or DC discharge between two electrodes, in which the space between the two electrodes contains the reacting gases. A triode electrode configuration may be also used for generating the glow discharge, as known in the art. The electrical energy transforms the gas mixture into reactive radicals, ions, neutral atoms and molecules, and other highly excited species. Chemical reactions are involved in the process, which occur after creation of a plasma of the reacting gases. For example, the atomic and molecular fragments interact with a deposition substrate to form a deposited material layer. A plasma is a gas in which a majority of the atoms or molecules are ionized. In one embodiment, fractional ionization in plasmas used for deposition and related materials processing varies from $10^{-4}$, in typical capacitive discharges, to as high as 5-10%, in high density inductive plasmas. Plasmas are typically operated at pressures of a few millitorr, e.g., 1 millitorr to 10 millitorr, to a few ton, e.g., 1 ton to 10 ton, although arc discharges and inductive plasmas can be ignited at atmospheric pressure. The plasma may be provided by radio-frequency capacitive discharge, inductively coupled plasma (ICP), electron cylclotron resonance (ECR), and helicon waves.

In one embodiment, PECVD can be performed at a deposition temperature ranging from 50° C. to 400° C., and at a pressure from 0.1 Torr to 10 Torr. In another embodiment, the PECVD can be performed at a deposition temperature ranging from 100° C. to 350° C., and at a pressure ranging from 0.2 Torr to 5 Torr.

Deposition of the hydrogenated amorphous silicon containing material by PECVD includes at least one semiconductor material containing reactant gas and at least one hydrogen containing reactant gas. In one embodiment, the semiconductor material containing reactant gas for producing the hydrogenated amorphous silicon containing material includes at least one atom of silicon. For example, to provide the silicon component of the hydrogenated amorphous silicon, the semiconductor material containing reactant gas can include at least one of $SiH_4$, $Si_2H_6$, $SiH_2Cl_2$, $SiHCl_3$, and $SiCl_4$.

The hydrogen containing reactant gas for depositing the hydrogenated amorphous silicon containing material by PECVD may be hydrogen gas ($H_2$). The hydrogen atoms in the hydrogen gas are incorporated into the deposited material to form the hydrogenated amorphous silicon containing material. The hydrogen containing reactant gas may be accompanied with a carrier gas of at least one inert gas, such as He, Ne, Ar, Xe, Kr or a mixture thereof. In one embodiment, in which the hydrogen containing reactant gas is accompanied with a carrier gas, the ratio of the flow rate of the semiconductor material containing reactant gas to the combined hydrogen containing reactant gas and carrier gas may range from pure silane to 1:1000. In another embodiment, in which the hydrogen containing reactant gas is accompanied with a carrier gas, the ratio of the flow rate of the semiconductor material containing reactant gas to the combined hydrogen containing reactant gas and carrier gas may range from 1:10 to 1:200. Within the carrier gas, the ratio of hydrogen gas to the carrier gas can be from 1:5 to 5:1. In another embodiment, the ratio of hydrogen gas to the carrier gas can be from 1:2 to 2:1. The flow rate of each gas may be determined based on the size of the process chamber and the target pressure during the deposition process. It is noted that the above flow rates have been provided for illustrative purposes only, and that lesser and greater ratios may also be employed, in accordance with the present disclosure.

In one example, the RF power used for generating the plasma is in the range of 2 $mW/cm^2$ to 500 $mW/cm^2$. In another example, the RF power is in the range of 5 $mW/cm^2$ to 100 $mW/cm^2$. In one example, the frequency of the RF power is 13.56 MHz. In another example, the frequency of the RF power in the range of 5 MHz to 120 MHz.

When the hydrogenated amorphous silicon ($\alpha$-Si:H) containing material is deposited for the p-type conductivity semiconductor layer 20 and the n-type conductivity semiconductor layer 30, the dopant that provides the conductivity type of the material layer may be deposited in-situ. By in-situ it is meant that the dopant that provides the conductivity type of the material layer is introduced as the material layer is being formed or deposited.

In case of the p-type conductivity semiconductor layer 20, the reactant gas may further include a p-type dopant source. For example, diborane ($B_2H_6$) gas can be flown into the processing chamber concurrently with the semiconductor material containing reactant gas, the hydrogen containing reactant gas, and the optional carrier gas. Carbon may be incorporated into the p-type layer in-situ by flowing a carbon containing gas source such as $CH_4$, $C_2H_2$, $C_2H_4$, and $C_2H_6$.

In the case of the n-type conductivity semiconductor layer 30, the reactant gas may further include an n-type dopant source. For example, phosphene ($PH_3$) gas or arsine ($AsH_3$) gas can be flown into the processing chamber concurrently with the semiconductor material containing reactant gas, the hydrogen containing reactant gas, and the optional carrier gas.

Following the formation of the hydrogenated amorphous silicon, the hydrogenated amorphous silicon may be treated with a deuterium containing gas at least through one surface of the hydrogenated amorphous Si. In one embodiment, the hydrogenated amorphous silicon containing material is annealed in a deuterium containing atmosphere, wherein deuterium is introduced to the lattice of the hydrogenated amorphous silicon ($\alpha$-Si:H) containing material. In one embodiment, the deuterium containing gas is composed of 100% deuterium gas ($D_2$). In some embodiments, the deuterium containing gas may further include a carrier gas, such as helium (He), argon (Ar), krypton (Kr), nitrogen ($N_2$) or a combination thereof. For example, when the deuterium containing gas includes a carrier gas, such as helium (He) in combination with deuterium gas ($D_2$), the carrier gas may be present in less than 50%, typically being present in less than 25%.

In one embodiment, the hydrogenated amorphous silicon ($\alpha$-Si:H) may be treated with a deuterium containing gas at least through one surface at a pressure that is greater than 5 ATM. In another embodiment, the deuterium containing gas may be applied to the surface of the hydrogenated amorphous silicon ($\alpha$-Si:H) at a pressure greater than 20 ATM. The temperature at which the deuterium containing gas may be applied to the surface of the hydrogenated amorphous silicon ($\alpha$-Si:H) may range from 100° C. to 400° C. In one embodiment, the temperature at which the deuterium containing gas may be applied to the surface of the hydrogenated amorphous silicon ($\alpha$-Si:H) may range from 150° C. to 350° C. The flow rate of the deuterium containing gas may depend on the chamber size in which the deuterium containing gas is being applied. In one example, the deuterium containing gas may be applied at a flow rate ranging from 10 sccm to 50 sccm.

As a result, of the deuterium containing gas being applied to the hydrogenated amorphous silicon, the deuterium is incorporated into the lattice of the hydrogenated amorphous silicon, and silicon deuterium bonds are formed at silicon sites where hydrogen is lost during the anneal or at the silicon dangling bonds, i.e., unsaturated silicon sites, that existed prior to the anneal. Following, the treatment of the hydrogenated amorphous silicon with the deuterium containing gas, the hydrogenated amorphous silicon is converted to a hydrogenated amorphous silicon and deuterium containing material.

The process of converting hydrogenated amorphous silicon to the hydrogenated amorphous silicon and deuterium containing material may be employed to form at least one of the p-type conductivity semiconductor layer 20, the intrinsic semiconductor layer 25 and the n-type conductivity semiconductor layer 30 to provide the p-i-n junction. In one embodiment, the p-type conductivity semiconductor layer 20, the intrinsic semiconductor layer 35, and the n-type conductivity semiconductor layer 30 are formed using a three-stage deposition process. For example, the first stage of the three-stage deposition process may deposit a p-type conductivity semiconductor layer 20, the second stage of the three-stage deposition process may deposit the intrinsic semiconductor layer 25, and the third stage of the three-stage deposition process may deposit the n-type semiconductor layer 30. In another embodiment, at least one of the p-type conductivity semiconductor layer 20, the intrinsic semiconductor layer 25, and the n-type semiconductor layer 30 is hydrogenated amorphous silicon (α-Si:H) that is not treated with a deuterium containing gas. In one embodiment, at least one of the p-type conductivity semiconductor layer 20, the intrinsic semiconductor layer 25, and the n-type conductivity semiconductor layer 30 is crystalline silicon (c-Si). The crystalline silicon (c-Si) may be formed using a chemical vapor deposition process, such as atomic pressure chemical vapor deposition (APCVD), low pressure chemical vapor deposition (LPCVD), plasma enhanced chemical vapor deposition (PECVD), metal organic chemical vapor deposition (MOCVD) and combinations thereof.

Following the formation of the p-i-n junction, the back contact metallization structure 35 may be formed on the n-type conductivity semiconductor layer 30. In one embodiment, the back contact metallization structure 35 may be deposited on the n-type conductivity semiconductor layer 30 by electroplating, electroless plating, physical vapor deposition, chemical vapor deposition, vacuum evaporation, or a combination thereof.

Figure 3:
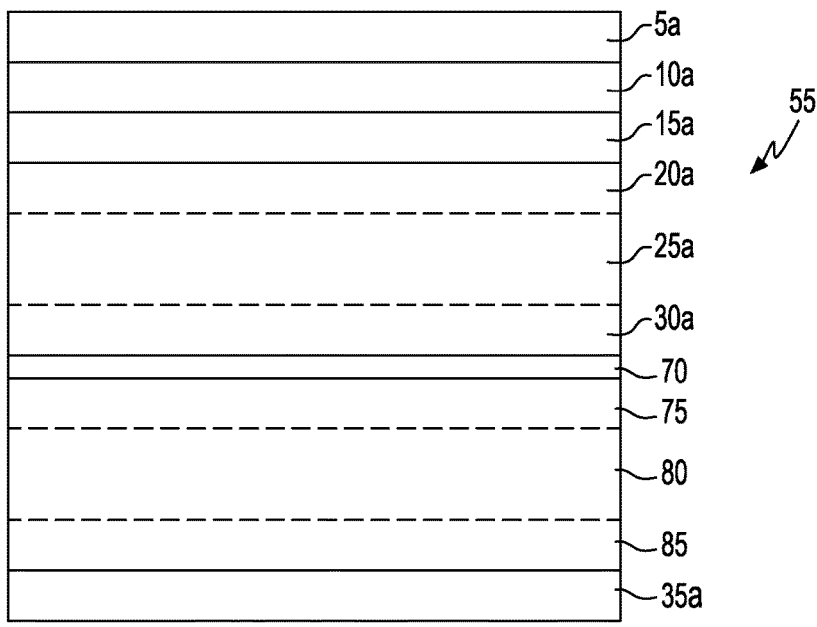
FIG. 3 is a side cross-sectional view of a photovoltaic device including a double junction p-i-n solar cell, wherein at least one material layer of the photovoltaic device is composed of a hydrogenated amorphous silicon and deuterium containing material, in accordance with one embodiment of the present disclosure.

FIG. 3 depicts one embodiment of a double junction photovoltaic device 55 including a double junction p-i-n solar cell, wherein at least one material layer of the photovoltaic device 55 is composed of a hydrogenated amorphous silicon and deuterium containing material. By employing two p-i-n junctions, the range of light waves absorbed by the double junction photovoltaic device 55 may be increased, when compared to a single junction semiconductor device. In one embodiment, when the p-i-n junction in the upper cell 60 is composed of a hydrogenated amorphous silicon and deuterium containing material, the lower cell 65 is composed of a hydrogenated amorphous silicon and deuterium containing material that is alloyed with germanium.

The double junction photovoltaic device 55 that is depicted in FIG. 3 is similar to the single junction photovoltaic device 50 that is depicted in FIG. 2, wherein the upper cell 60 of the double junction photovoltaic device 55 is substantially similar to the single junction photovoltaic device 50. More specifically, the substrate 5a, oxide containing passivation layer 10a, transparent conductive material layer 15a, p-type conductivity semiconductor layer 20a, intrinsic semiconductor layer 25a, and n-type conductivity semiconductor layer 30a in the top cell 60 of the double junction photovoltaic device 55 is substantially similar to the substrate 5, oxide containing passivation layer 10, transparent conductive material layer 15, p-type conductivity semiconductor layer 20, intrinsic semiconductor layer 25, and n-type conductivity semiconductor layer 30 of the single junction photovoltaic device 50. Therefore, the description of the substrate 5, oxide containing passivation layer 10, transparent conductive material layer 15, p-type conductivity semiconductor layer 20, intrinsic semiconductor layer 25, and n-type conductivity semiconductor layer 30 of the single junction photovoltaic device 50 that are depicted in FIG. 2 are suitable for the substrate 5a, oxide containing passivation layer 10a, transparent conductive material layer 15a, p-type conductivity semiconductor layer 20a, intrinsic semiconductor layer 25a, and n-type conductivity semiconductor layer 30a of the double junction photovoltaic device 55 that is depicted in FIG. 3.

In one embodiment, the upper cell 60 of the double junction photovoltaic device 55 is separated from the lower cell 65 of the double junction photovoltaic device 55 by a tunneling layer 70. The role of the optional tunneling layer is to enhance the tunneling of the carriers at the $p^+/n^+$ tunneling junction formed at the interface between the top cell and the bottom cell. In one embodiment, the tunneling layer 70 may be composed of a transparent conductive material such as a transparent conductive oxide. In one embodiment, the tunneling layer 70 may have a thickness ranging from 5 nm to 15 nm, although larger and lesser thicknesses may be also used.

Still referring to FIG. 3, the bottom cell 65 of the double junction photovoltaic device 55 includes a p-i-n junction, in which the materials for each of the p-type conductivity semiconductor layer 75, intrinsic semiconductor layer 80, and the n-type conductivity semiconductor layer 85 are selected to have a lower band gap than the materials selected for the p-type conductivity semiconductor layer 20a, intrinsic semiconductor layer 25a, and n-type conductivity semiconductor layer 30a of the upper cell 60 of the double junction photovoltaic device 55. For example, when at least one of the p-type conductivity semiconductor layer 20a, the intrinsic semiconductor layer 25a, and the n-type conductivity semiconductor layer 30a of the upper cell 60 of the double junction photovoltaic device 55 are composed of hydrogenated amorphous silicon and deuterium containing material which may also contain carbon, the material for at least one of the p-type conductivity semiconductor layer 75, the intrinsic semiconductor layer 80, and the n-type conductivity semiconductor layer 85 of the lower cell 65 of the double junction photovoltaic device 55 may include an hydrogenated amorphous silicon material with further alloying elements, such as germanium which may also deuterium, or may include a hydrogenated nanocrystalline or microcrystalline silicon containing material which may also contain deuterium. The addition of germanium decreases the band gap of the hydrogenated amorphous silicon and deuterium containing material, and the addition of carbon increases the band gap of the hydrogenated amorphous silicon and deuterium containing material.

When at least one of the p-type conductivity semiconductor layer 75, the intrinsic semiconductor layer 80, and/or the n-type conductivity semiconductor layer 85 of the lower cell 65 of the double junction photovoltaic device 55 is composed of hydrogenated amorphous silicon and deuterium containing material alloyed with carbon, the carbon may be introduced during the PECVD process that forms the hydrogenated amorphous silicon prior to the deuterium gas treatment. More specifically, during the deposition process, a carbon containing reactant gas can be flown into the processing chamber during deposition of the hydrogenated amorphous silicon. The carbon containing reactant gas can be flown into the processing chamber either continuously or intermittently. The carbon containing reactant gas can be any hydrocarbon gas including, but not limited to, $CH_4$, $C_2H_2$, $C_2H_4$, and $C_2H_6$. The carbon containing gas reactant may be introduced to the deposition chamber concurrently with the silicon source that is provided by the semiconductor material containing reactant gas, e.g., $SiH_4$, $Si_2H_6$, $SiH_2Cl_2$, $SiHCl_3$, $SiCl_4$ or a combination thereof, and the hydrogen containing reactant gas. The carbon containing gas may also be accompanied with a carrier gas, such as hydrogen.

When the hydrogenated amorphous silicon and deuterium containing material alloyed with carbon is doped with a p-type conductivity dopant to provide the p-type conductivity semiconductor layer 75, the p-type dopant may be introduced in-situ during the deposition process for forming the hydrogenated amorphous silicon containing material. Specifically, the p-type dopant, e.g., boron, may be introduced to the material layer being deposited by a p-type dopant gas, e.g., diborane ($B_2H_6$), that may enter the deposition chamber concurrently with, or separately from, the semiconductor material containing reactant gas, hydrogen containing reactant gas, and/or the carbon containing reactant gas.

When the hydrogenated amorphous silicon and deuterium containing material alloyed with carbon is doped with an n-type conductivity dopant to provide the n-type conductivity semiconductor layer 85, the n-type dopant may be introduced in-situ during the deposition process for forming the hydrogenated amorphous silicon containing material. Specifically, the n-type dopant, e.g., phosphorus or arsenic, may be introduced to the material layer being deposited by a n-type dopant gas, e.g., phosphene ($PH_3$) gas or arsine ($AsH_3$), that may enter the deposition chamber concurrently with, or separately from, the semiconductor material containing reactant gas, hydrogen containing reactant gas, and/or the carbon containing reactant gas.

The deuterium containing gas treatment for introducing deuterium into the lattice of the hydrogenated amorphous silicon and deuterium containing material that is alloyed with carbon is similar to the deuterium containing gas treatment that is described above for introducing deuterium into the lattice of the hydrogenated amorphous silicon that is described above with reference to FIG. 2.

The atomic concentration of carbon in the hydrogenated amorphous silicon and deuterium containing material that is alloyed with carbon can be from 1% to 50%. In another embodiment, the atomic concentration of carbon in the hydrogenated amorphous silicon and deuterium containing material alloyed with carbon can be from 5% to 30%. The atomic concentration of silicon in the hydrogenated amorphous silicon and deuterium containing material alloyed with carbon can be from 50% to 95%. In another embodiment, the atomic concentration of silicon in the hydrogenated amorphous silicon and deuterium containing material alloyed with carbon can be from 75% to 85%. The atomic concentration of deuterium in the hydrogenated amorphous silicon and deuterium containing material alloyed with carbon is greater than 0.001%. In another embodiment, the atomic concentration of deuterium in the hydrogenated amorphous silicon and deuterium containing material alloyed with carbon can be from 0.001% to 1%. When employed in the p-type conductivity semiconductor layer 75, the hydrogenated amorphous silicon and deuterium containing material that is alloyed with carbon further contains a concentration of p-type dopant ranging from $10^{16}$ atoms/$cm^3$ to $10^{21}$ atoms/$cm^3$ with the range of $10^{18}$ atoms/$cm^3$ to $10^{20}$ atoms/$cm^3$ being more typical. The doping efficiency (the ratio of activated dopant atoms, to the total dopant atoms) in layer 75 typically ranges from 0.1% to 20% although higher and lower doping efficiencies are possible. Typically, the doping efficiency is decreased by increasing the dopant atom concentration. Likewise, when employed in the n-type conductivity semiconductor layer 75, the hydrogenated amorphous silicon and deuterium containing material that is alloyed with carbon further contains a concentration of n-type dopant ranging from $10^{16}$ atoms/$cm^3$ to $10^{21}$ atoms/$cm^3$ with the range of $10^{18}$ atoms/$cm^3$ to $10^{20}$ atoms/$cm^3$ being more typical. The doping efficiency (the ratio of activated dopant atoms, to the total dopant atoms) in layer 75 typically ranges from 0.1% to 20% although higher and lower doping efficiencies are possible. Typically, the doping efficiency is decreased by increasing the dopant atom concentration.

The band gap of the p-type conductivity semiconductor layer 75 of the lower cell 65 that is composed of hydrogenated amorphous silicon and deuterium containing material that is alloyed with carbon may range from 1.7 eV to 2.5 eV, although higher and lower bandgaps may be also used. Layer 75 may contain carbon. In some embodiments, layer 75 comprises deuterium-containing hydrogenated amorphous silicon-carbide. The band gap of the intrinsic semiconductor layer 80 composed of hydrogenated amorphous silicon and deuterium containing material that is alloyed with carbon may range from 1.6 eV to 1.8 eV. The band gap of the n-type conductivity semiconductor layer 85 of the lower cell 65 that is composed of hydrogenated amorphous silicon and deuterium containing material that is alloyed with carbon may range from 1.6 eV to 1.8 eV.

When at least one of the p-type conductivity semiconductor layer 75, the intrinsic semiconductor layer 80, and/or the n-type conductivity semiconductor layer 85 of the lower cell 65 of the double junction photovoltaic device 55 is composed of hydrogenated amorphous silicon and deuterium containing material alloyed with germanium, the germanium may be introduced during the PECVD process that forms the hydrogenated amorphous silicon (α-Si:H) prior to the deuterium gas treatment. More specifically, during the deposition process, a germanium-containing reactant gas can be flown into the processing chamber during deposition of the hydrogenated amorphous silicon (α-Si:H). The germanium-containing gas reactant can be flown into the processing chamber either continuously or intermittently. The germanium-containing gas reactant can be any germanium gas including, but not limited to, GeH4, $Ge_2H_6$, $GeH_2Cl_2$ and $Ge_2Cl_4$. The germanium-containing gas reactant may be introduced to the deposition chamber concurrently with the silicon source that is provided by the semiconductor-material-containing reactant gas, e.g., $SiH_4$, $Si_2H_6$, $SiH_2Cl_2$, $SiHCl_3$, $SiCl_4$ or a combination thereof, and the hydrogen containing reactant gas. The germanium-containing gas may also be accompanied with a carrier gas, such as hydrogen.

When the hydrogenated amorphous silicon and deuterium containing material alloyed with germanium is doped with a p-type conductivity dopant to provide the p-type conductivity semiconductor layer 75, the p-type dopant may be introduced in-situ during the deposition process. Specifically, the p-type dopant, e.g., boron, may be introduced to the material layer being deposited, e.g., hydrogenated amorphous silicon, by a p-type dopant gas, e.g., diborane ($B_2H_6$), that may enter the deposition chamber concurrently with, or separately from, the semiconductor material containing reactant gas, hydrogen containing reactant gas, and/or the germanium containing reactant gas.

When the hydrogenated amorphous silicon and deuterium containing material alloyed with germanium is doped with an n-type conductivity dopant to provide the n-type conductivity semiconductor layer 85, the n-type dopant may be introduced in-situ during the deposition. Specifically, the n-type dopant, e.g., phosphorus or arsenic, may be introduced to the material layer being deposited, e.g., hydrogenated amorphous silicon, by an n-type dopant gas, e.g., phosphene ($PH_3$) gas or arsine ($AsH_3$), that may enter the deposition chamber concurrently with, or separately from, the semiconductor material containing reactant gas, hydrogen containing reactant gas, and/or the germanium containing reactant gas.

The deuterium containing gas treatment for introducing deuterium into the lattice of the hydrogenated amorphous silicon and deuterium containing material that is alloyed with germanium is similar to the deuterium containing gas treatment that is described above for introducing deuterium into the lattice of the hydrogenated amorphous silicon that is described above with reference to FIG. 2.

The atomic concentration of germanium in the hydrogenated amorphous silicon and deuterium containing material that is alloyed with germanium can be from 0% to 100%, with the range of 1% to 50% being more typical. In some embodiments, the atomic concentration of germanium in the hydrogenated amorphous silicon and deuterium containing material alloyed with germanium can be from 5% to 30%. In one embodiment, the atomic concentration of silicon in the hydrogenated amorphous silicon and deuterium containing material alloyed with germanium can be from 50% to 95%. In another embodiment, the atomic concentration of germanium in the hydrogenated amorphous silicon and deuterium containing material alloyed with germanium can be from 75% to 85%. The atomic concentration of deuterium in the hydrogenated amorphous silicon and deuterium containing material alloyed with carbon is greater than 0.001%. In another embodiment, the atomic concentration of deuterium in the hydrogenated amorphous silicon and deuterium containing material alloyed with germanium can be from 0.001% to 1%. When employed in the p-type conductivity semiconductor layer 75, the hydrogenated amorphous silicon and deuterium containing material that is alloyed with germanium further contains a concentration of p-type dopant ranging from $10^{16}$ atoms/cm$^3$ to $10^{20}$ atoms/cm$^3$ with the range of $10^{18}$ atoms/cm$^3$ to $10^{20}$ atoms/cm$^3$ being more typical. The doping efficiency (the ratio of activated dopant atoms, to the total dopant atoms) in layer 75 typically ranges from 0.1% to 20% although higher and lower doping efficiencies are possible. Typically, the doping efficiency is decreased by increasing the dopant atom concentration. Likewise, when employed in the n-type conductivity semiconductor layer 85, the hydrogenated amorphous silicon and deuterium containing material that is alloyed with germanium further contains a concentration of n-type dopant ranging from $10^{16}$ atoms/cm$^3$ to $10^{20}$ atoms/cm$^3$ with the range of $10^{18}$ atoms/cm$^3$ to $10^{20}$ atoms/cm$^3$ being more typical. The doping efficiency (the ratio of activated dopant atoms, to the total dopant atoms) in layer 75 typically ranges from 0.1% to 20% although higher and lower doping efficiencies are possible. Typically, the doping efficiency is decreased by increasing the dopant atom concentration.

The band gap of the p-type conductivity semiconductor layer 75 of the lower cell 65 that is composed of hydrogenated amorphous silicon and deuterium containing material that is alloyed with germanium may range from 0.7 eV to 1.7 eV, with the range of 1.0 eV to 1.5 eV being more typical. The band gap of the intrinsic semiconductor layer 80 composed of hydrogenated amorphous silicon and deuterium containing material that is alloyed with germanium may range from 0.7 eV to 1.7 eV, with the range of 1.0 eV to 1.5 eV being more typical. The band gap of the n-type conductivity semiconductor layer 85 of the lower cell 65 that is composed of hydrogenated amorphous silicon and deuterium containing material that is alloyed with germanium may range from 0.7 eV to 1.7 eV, with the range of 1.0 eV to 1.5 eV being more typical.

Still referring to FIG. 3, the double junction photovoltaic device 55 further includes a back contact metallization structure 35a. The back contact metallization structure 35a that is depicted in FIG. 3 is similar to the back contact metallization structure 35 of the single junction photovoltaic device 50 that is described above with reference to FIG. 2. Therefore, the description of the back contact metallization structure 35 that is depicted in FIG. 2 is suitable for the back contact metallization structure 35a of the dual junction photovoltaic device 55 that is depicted in FIG. 3.

Figure 4:
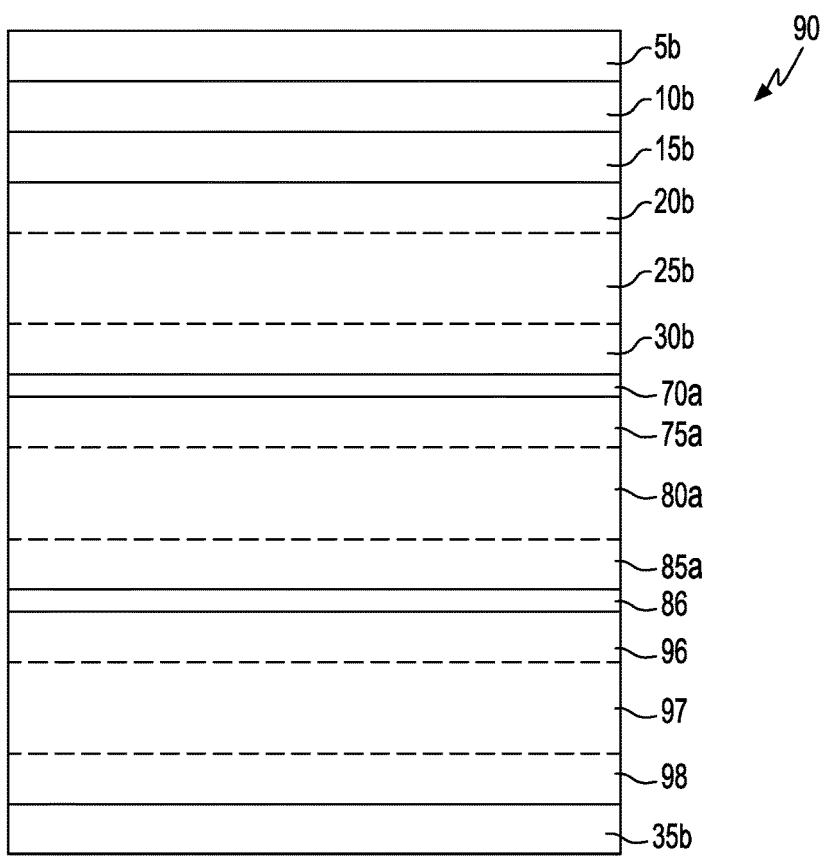
FIG. 4 is a side cross-sectional view of a photovoltaic device including a triple junction p-i-n solar cell, wherein at least one material layer of the photovoltaic device is composed of a hydrogenated amorphous silicon and deuterium containing material, in accordance with one embodiment of the present disclosure.

FIG. 4 depicts one embodiment of a photovoltaic device 90 including a triple junction p-i-n solar cell, wherein at least one material layer of the photovoltaic device 90 is composed of hydrogenated amorphous silicon and deuterium containing material. The triple junction p-i-n solar cell that is depicted in FIG. 4 is similar to the double junction p-i-n solar cell that is depicted in FIG. 3. The materials that are employed in the p-i-n junction of the upper cell 60a, middle cell 65a, and the lower cell 90 of the triple junction photovoltaic device 90 are selected to have different band gaps, so that the upper cell 60a, middle cell 65a, and the lower cell 95 of the triple junction photovoltaic device 90 absorb different light wavelengths in the production of energy.

The triple junction photovoltaic device 90 that is depicted in FIG. 4 includes a substrate 5b, an oxide containing passivation layer 10b, and a transparent conductive material layer 15b that are similar to the substrate 5, the oxide containing passivation layer 10, and the transparent conductive material layer 15 that are depicted in FIG. 2. Therefore, the description of the substrate 5, the oxide containing passivation layer 10, and the transparent conductive material layer 15 that are depicted in FIG. 2, is suitable for the substrate 5b, the oxide containing passivation layer 10b, and the transparent conductive material layer 15b that is depicted in FIG. 4.

In one embodiment, the upper cell 60a of the triple junction photovoltaic device 90 includes a p-type conductivity semiconductor layer 20b, an intrinsic semiconductor layer 25b, and an n-type conductivity semiconductor layer 30b that may each be composed of a hydrogenated amorphous silicon and deuterium containing material that is alloyed with carbon. The hydrogenated amorphous silicon and deuterium containing material alloyed with carbon, and method of forming thereof, which is utilized for at least one of the p-type conductivity semiconductor layer 20b, the intrinsic semiconductor layer 25b, and the n-type conductivity semiconductor layer 30b, is described above as a material for one embodiment of the lower cell 65 of the dual junction photovoltaic device 50 that is depicted in FIG. 3.

The upper cell 60a of the triple junction photovoltaic device 90 may be separated from the middle cell 65a of the triple junction photovoltaic device 90 by a first tunnel junction layer 70a. The first tunnel junction layer 70a may be composed of a transparent conductive material sucha s a transparent conductive oxide. The role of the optional tunneling layer is to enhance the tunneling of the carriers at the $p^+/n^+$ tunneling junction formed at the interface between the top cell and the middle cell. The first tunnel junction layer 70a may have a thickness ranging from 5 nm to 15 nm, although thinner or thicker tunneling layers may be also used.

In one embodiment, the middle cell 65a of the triple junction photovoltaic device 90 includes an n-type conductivity semiconductor layer 75a, intrinsic semiconductor layer 80a, and a p-type conductivity semiconductor layer 85a that may each be composed of a hydrogenated amorphous silicon and deuterium containing material. The n-type conductivity semiconductor layer 20b, intrinsic semiconductor layer 25b, and the p-type conductivity semiconductor layer 35b of the middle cell 65a of the triple junction photovoltaic device 90, are similar to the n-type conductivity semiconductor layer 20, intrinsic semiconductor layer 25, and the p-type conductivity semiconductor layer 35 of the p-i-n junction of the single junction photovoltaic device 50 that is depicted in FIG. 2. Therefore, the description of the n-type conductivity semiconductor layer 20, intrinsic semiconductor layer 25, and the p-type conductivity semiconductor layer 35 of the p-i-n junction of the single junction photovoltaic device 50 that is depicted in FIG. 2, is suitable for the n-type conductivity semiconductor layer 75a, intrinsic semiconductor layer 80a, and the p-type conductivity semiconductor layer 85a of the middle cell 65a of the triple junction photovoltaic device 90.

The middle cell 65a of the triple junction photovoltaic device 95 may be separated from the lower cell 95 of the triple junction photovoltaic device 90 by a second tunnel junction layer 86. The second tunnel junction layer 86 may be composed of a transparent conductive material such as a transparent conductive oxide. The role of the optional tunneling layer is to enhance the tunneling of the carriers at the $p^+/n^+$ tunneling junction formed at the interface between the middle cell and the bottom cell. The second tunneling layer 86 may have a thickness ranging from 5 nm to 15 nm, although thinner or thicker tunneling layers may be also used.

Still referring to FIG. 4, in one embodiment, the bottom cell 95 of the triple junction photovoltaic device 90 includes a p-type conductivity semiconductor layer 96, intrinsic semiconductor layer 97, and an n-type conductivity semiconductor layer 98 that may each be composed of a hydrogenated amorphous silicon and deuterium containing material that is alloyed with germanium. The hydrogenated amorphous silicon and deuterium containing material that is alloyed with germanium, and method of forming thereof, which is utilized for at least one of the p-type conductivity semiconductor layer 96, intrinsic semiconductor layer 97, and the n-type conductivity semiconductor layer 98, is described above as a material for one embodiment of the lower cell 65 of the dual junction photovoltaic device 50 that is depicted in FIG. 3.

The triple junction photovoltaic device 90 further includes a back contact metallization structure 35b. The back contact metallization structure 35b that is depicted in FIG. 4 is similar to the back contact metallization structure 35 of the single junction photovoltaic device 50 that is described above with reference to FIG. 2. Therefore, the description of the back contact metallization structure 35 that is depicted in FIG. 2 is suitable for the back contact metallization structure 35b of the triple junction photovoltaic device 90 that is depicted in FIG. 4.

Figure 5A:
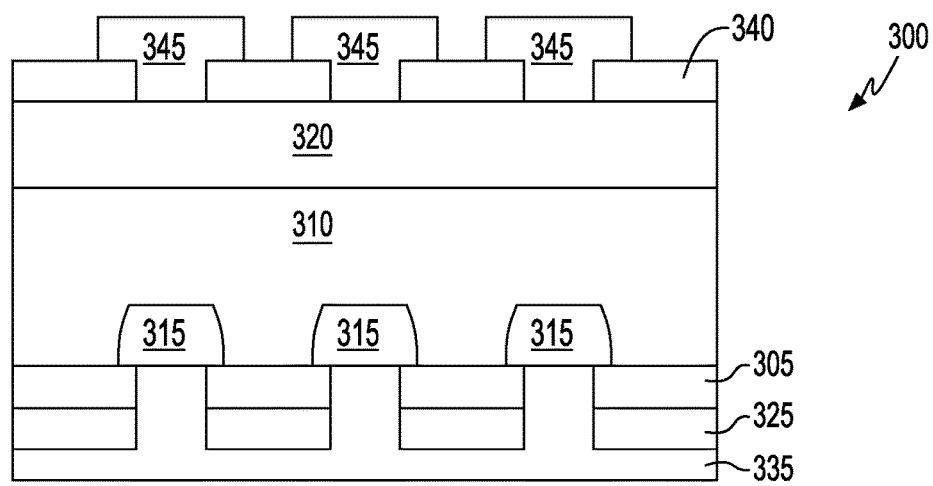
FIG. 5A is a side cross-sectional view of a photovoltaic device including a heterojunction solar cell with single crystalline silicon (c-Si) absorption layers, and an emitter structure or passivation layer composed of a hydrogenated amorphous silicon and deuterium containing material, in accordance with one embodiment of the present disclosure.

FIG. 5A depicts a photovoltaic device 300 with a single crystalline silicon (c-Si) absorption layer 310, and a back contact structure 430 composed of hydrogenated amorphous silicon and deuterium containing material. The "absorption layer" is the material that readily absorbs photons to generate charge carriers, i.e., free electrons or holes. A portion of the photovoltaic device, between the front side and the absorption layer is referred to as the "emitter layer", and the junction with the absorption layer is referred to as the "emitter junction". The emitter layer may be present atop the absorption layer, in which the emitter layer has a conductivity type that is opposite the conductivity type as the absorption layer. In one example, when the Sun's energy in the form of photons collects in the cell layers, electron-hole pairs are generated in the material within the photovoltaic device. The emitter junction provides the required electric field for the collection of the photo-generated electrons and holes on the p-doped and n-doped sides of the emitter junction, respectively. For this reason, and in this example, at least one p-type layer of the photovoltaic device may provide the absorption layer, and at least one adjacent n-type layer may provide the emitter layer. In other examples, the absorption layer may be doped to an n-type conductivity, and the emitter layer may be doped to a p-type conductivity. In heterojunction solar cells, such as the embodiments depicted in FIGS. 5-7, the absorption layer 310 is the starting substrate, whereas in p-i-n photovoltaic devices consistent with the embodiments depicted in FIG. 1-4, the absorption layer is a deposited layer, such as the intrinsic semiconductor layer 25, 25a, 25b.

In the embodiment depicted in FIG. 5A, the photovoltaic device 300 includes an emitter structure 320. In one embodiment, the emitter structure 320 has a second conductivity type, e.g., n-type, and is formed on a single crystalline silicon (c-Si) absorption layer 310 having a first conductivity type, e.g., p-type.

The term "single crystalline" denotes a crystalline solid, in which the crystal lattice of the entire sample is substantially continuous and substantially unbroken to the edges of the sample, with substantially no grain boundaries. In another embodiment, the crystalline semiconductor material of the absorption layer 310 is of a multi-crystalline structure. Contrary to a single crystal crystalline structure, a multicrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns). The crystalline semiconductor material of the absorption layer 310 is typically a silicon containing material. In one embodiment, the absorption layer 310 is composed of at least one of Si, Ge, SiGe, SiC, and SiGeC. In yet another embodiment, the absorption layer 310 may be a compound semiconductor, such as a type III-IV semiconductors, e.g., GaAs. In one example, the crystalline semiconductor material of the absorption layer 310 is composed of single crystal Si. In one embodiment, the absorption layer 310 has a thickness ranging from 50 nm to 1 mm. In another embodiment, the absorption layer 310 has a thickness ranging from 1 μm to 500 μm.

In one embodiment, the absorption layer 310 is doped with a p-type dopant that is present in a concentration ranging from $1\times10^9$ atoms/cm$^3$ to $1\times10^{20}$ atoms/cm$^3$. In another embodiment, the concentration of the p-type dopant that is present in the absorption layer 310 ranges from $1\times10^{14}$ atoms/cm$^3$ to $1\times10^{19}$ atoms/cm$^3$. The dopant concentration of the p-type dopant in the absorption layer 310 may be graded or uniform. By "uniform" it is meant that the dopant concentration is the same throughout the entire thickness of the absorption layer 310. For example, an absorption layer 310 having a uniform dopant concentration may have the same dopant concentration at the upper surface and bottom surface of the absorption layer 310, as well as the same dopant concentration at a central portion of the absorption layer 310 between the upper surface and the bottom surface of the absorption layer 10. By "graded" it is meant that the dopant concentration varies throughout the thickness of the absorption layer 10. In on embodiment, the band gap of the absorption layer 310 can be from 0.1 eV to 7.0 eV. The absorption layer 310 may also be doped to an n-type conductivity.

Still referring to FIG. 5A, a passivation layer 305 is present underlying the absorption layer 310. The passivation layer 305 is typically intrinsic. The passivation layer 305 serves to passivate the back surface of the absorption layer 310, and reduce electron-hole recombination. In one embodiment, the passivation layer 305 may be composed of a hydrogenated amorphous silicon and deuterium containing material. The hydrogenated amorphous silicon and deuterium containing material may be similar in composition to the hydrogenated amorphous silicon and deuterium containing material that utilized in the p-i-n junctions of the photovoltaic cells 50, 60, 60a, 65, 65a, 95 that are described above with reference to FIGS. 2-4. Therefore, the composition and method of making the hydrogenated amorphous silicon and deuterium containing material that is described above with reference to FIGS. 2-4 is suitable for providing the passivation layer 305 that is depicted in FIG. 5A. As indicated above, the presence of deuterium in the hydrogenated amorphous silicon and deuterium containing material increases the stability of the material for the back surface field layer 305, and reduces the Staebler-Wronski effect. In some embodiments, the hydrogenated amorphous silicon and deuterium containing material that is provided for the back surface field layer 305 may further include alloying additions of germanium and carbon.

The passivation layer 305 may have a thickness ranging from 2 nm to 1 µm. In another embodiment, the passivation layer 305 has a thickness ranging from 5 nm to 300 nm. In one embodiment, a semiconductor substrate can provide the absorption layer 310, and the passivation layer 305 can be deposited onto the semiconductor substrate. For example, when the passivation layer 305 is composed of hydrogenated amorphous silicon and deuterium containing material, a material layer of amorphous hydrogenated silicon can be deposited onto the semiconductor substrate that provides the absorption layer 310 using plasma enhanced chemical vapor deposition (PECVD), wherein the deuterium is introduced to the amorphous hydrogenated silicon by a deuterium containing gas treatment that is applied to the amorphous hydrogenated silicon after it has been deposited.

In the embodiment that is depicted in FIG. 5A, the passivation layer 305 is not a continuous layer across the entirety of the back surface of the absorption layer 310. In this embodiment, localized back surface field regions 315 are present on the back surface of the absorption layer 310 and are contained within openings in the passivation layer 305. Still referring to FIG. 5A, the photovoltaic device 300 may further include an optional dielectric layer 325 on the passivation layer 305. The dielectric layer 325 may be composed of amorphous hydrogenated silicon nitride or amorphous hydrogenated silicon oxide. The dielectric layer 325 may provide further passivation and/or reflectivity to the back surface of the photovoltaic cell.

In one embodiment, forming the localized back surface field regions 315 to the absorption layer 310 may begin with forming the dielectric layer 325. The dielectric layer 325 may be formed using a deposition process, such as CVD. Variations of CVD processes suitable for depositing the dielectric layer 325 include, but are not limited to, Atmospheric Pressure CVD (APCVD), Low Pressure CVD (LPCVD) and Plasma Enhanced CVD (PECVD), Metal-Organic CVD (MOCVD) and combinations thereof. The dielectric layer 325 may have a thickness ranging from 5 nm to 1 µm, with a range of 50 nm to 300 nm being more typical.

In one embodiment, at least one opening may be formed through at least the passivation layer 305, and the optional dielectric layer 325 when present, to expose at least a portion of the back surface of the absorption layer 310. In one embodiment, forming the at least one opening through the passivation layer 305 and the optional dielectric layer 325 to expose at least a portion of the back surface of the absorption layer 310 includes forming a patterned etch mask (not shown) on the passivation layer 305 and the optional dielectric layer 325, and etching exposed portions of the passivation layer 305 and the optional dielectric layer 325 selectively to the patterned etch mask and the back surface of the absorption layer 310.

Specifically, and in one example, a patterned etch mask is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. In some examples, the selectivity may be greater than 100:1, e.g., 1000:1.

In one embodiment, the etch process removes the exposed portions of the back surface field layer 305 and the optional dielectric layer 325 with an etch chemistry that is selective to the back surface of the absorption layer 310. In one embodiment, the etch process that forms the openings is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Following the formation of the openings that expose the back surface of the absorption layer 310, the localized back surface field regions 315 may be formed in the absorption layer 310 by introducing the dopant for the localized back surface field regions 315 through the openings into the back surface of the absorption layer 310. For example, the dopant that provides the conductivity type of the localized back surface field regions 315 may be introduced to the absorption layer 310 using ion implantation or gas vapor phase deposition, and then diffused into a depth of the semiconductor substrate to provide the localized back surface field regions 315. The localized back surface field regions 315 are doped to the same conductivity type as the absorption layer 310. For example, when the absorption layer 310 is of a p-type conductivity, the localized back surface field regions 315 are of a p-type conductivity. As used herein, a "back surface field (BSF) region" is a higher doped layer at the back surface of the absorption layer 310. The interface between the high and low doped regions produces an electric field that functions as a barrier to minority carrier flow to the back surface of the absorption layer 310. For example, an electric field that is suitable for obstructing recombination of minority carriers, e.g., electrons, may be produced by an interface between a highly doped p-type back surface field regions 305, e.g., having a p-type dopant concentration ranging from $1 \times 10^{17}$ atoms/cm$^3$ to $5 \times 10^{20}$ atom/cm$^3$, and a p-type absorption layer 310, e.g., having a p-type dopant concentration ranging from $1 \times 10^{14}$ atoms/cm$^3$ to $1 \times 10^{18}$ atom/cm$^3$.

Following the formation of the localized back surface field regions 315, bottom metal contacts 335 may be formed in direct contact with the localized back surface field regions 315 and filling the openings through the back surface field layer 305 and the optional dielectric layer 325. The bottom metal contacts 335 may be blanket deposited using a physical vapor deposition (PVD) method, such as sputtering or plating. The bottom metal contacts 335 may be composed of any conductive material, such as aluminum, and may have a thickness ranging from 100 nm to 10 micrometers, although lesser and greater thicknesses can also be employed.

In one embodiment, the localized back surface field regions 315 may be omitted. In this embodiment, the metal contacts may be formed in direct contact with the back surface of the absorption layer 310 via the openings etched in the passivation layer 305 (and the optional layer 325 if present). This embodiment is typically referred to as a "localized back contact" structure, since the metal contact 335 is in local contact with the absorption layer 310 (i.e. via the openings).

Still referring to FIG. 5A, the emitter structure 320 may be formed on the face of the absorption layer 310 that is opposite the face of the absorption layer 310 that the back surface field layer 305 is present on. The emitter structure 320 has a conductivity type that is opposite the conductivity type of the absorption layer 310. For example, in the embodiments in which the absorption layer 310 has a p-type conductivity, the emitter structure 320 may have an n-type conductivity. In another example, in the embodiments in which the absorption layer 310 has an n-type conductivity, the emitter structure 320 has a p-type conductivity. The emitter structure 320 may be a material layer that is present on, and in direct contact with, the entire width of the absorption layer 310. Although not depicted in FIG. 5A, in some embodiments, an intrinsic semiconductor layer may be present between the absorption layer 310 and the emitter structure 320. In one example, the intrinsic semiconductor layer may be composed of a hydrogenated amorphous silicon or a hydrogenated amorphous silicon and deuterium containing material, in accordance with the present disclosure.

The emitter structure 320 may be composed of a hydrogenated amorphous silicon and deuterium containing material. The hydrogenated amorphous silicon and deuterium containing material is similar in composition to the hydrogenated amorphous silicon and deuterium containing material that is utilized in the p-i-n junctions of the photovoltaic cells 50, 55, 90 that are described above with reference to FIGS. 2-4. Therefore, the composition and method of making the hydrogenated amorphous silicon and deuterium containing material that is described above with reference to FIGS. 2-4 is suitable for providing the emitter structure 320 that is depicted in FIG. 5A. As indicated above, the presence of deuterium in the hydrogenated amorphous silicon and deuterium containing material increases the stability of the material for the emitter structure 320, and reduces the Staebler-Wronski effect. In some embodiment, the hydrogenated amorphous silicon and deuterium containing material that is provided for the emitter structure 320 may further include alloying additions of germanium and carbon. In another embodiment, the emitter structure 320 may be composed of a crystalline semiconductor layer, such as Si, Ge, SiGe, SiC, SiGeC and combinations thereof. The emitter structure 320 may also be a compound semiconductor, such as type III-IV semiconductors, e.g., GaAs.

In a silicon containing material, such as crystalline Si, examples of n-type dopants that provide the conductivity type of the emitter structure 320 include, but are not limited to, antimony, arsenic and phosphorous. For example, in one embodiment, in which the dopant that provides the conductivity type, e.g., n-type, of the emitter structure 320 ranges from $5 \times 10^{17}$ atoms/cm$^3$ to $10^{19}$ atoms/cm$^3$ An upper dielectric layer 340 may be present on the upper surface of the emitter structure 320, in which openings through the upper dielectric layer 340 are aligned to the emitter region 320. The upper dielectric layer 340 may be composed of silicon oxide, silicon nitride or a combination thereof. Openings may be present through the upper dielectric layer 340 to expose a portion emitter structure 320 openings may be filled with the front contact 345. The dielectric layer serves as a passivation layer, and/or an anti-reflection coating.

The emitter structure 320 may be formed atop the absorption layer 310. In the embodiments in which the emitter structure 320 is composed of hydrogenated amorphous silicon and deuterium containing material, the hydrogenated amorphous silicon and deuterium containing material may be formed on the absorption layer 310 using the same method that is described above for forming the hydrogenated amorphous silicon and deuterium containing material that is employed in the p-i-n junctions of the photovoltaic cells 50, 60, 60a, 65, 65a, 90 that are described above with reference to FIGS. 2-4. In the embodiments, in which the emitter structure 320 is composed of a crystalline semiconductor material, the crystalline semiconductor material may be deposited using a CVD process selected from the group consisting of atomic pressure chemical vapor deposition (APCVD), low pressure chemical vapor deposition (LP-CVD), plasma enhanced chemical vapor deposition (PECVD), metal organic chemical vapor deposition (MOCVD) and combinations thereof. The thickness of the layer that provides the emitter structure 320 may range from 2 nm to 2 μm. In another embodiment, the thickness of the layer that provides the emitter structure 320 may range from 3 nm to 500 nm.

The dopant that provides the conductivity type of the emitter structure 320 may be incorporated into the emitter structure 320 using in-situ doping during the deposition process that provides the material layer of the emitter structure 20. In another embodiment, the dopant that provides the conductivity type of the emitter structure 320 may be incorporated in the emitter structure 320 using ion implantation following the deposition process that provides the material layer of the emitter structure 20.

The upper dielectric layer 340 may be deposited using CVD, such as atomic pressure chemical vapor deposition (APCVD), low pressure chemical vapor deposition (LP-CVD), plasma enhanced chemical vapor deposition (PECVD), metal organic chemical vapor deposition (MOCVD) or combinations thereof. The method of forming the at least one opening through the upper dielectric layer 340 is similar to the method of forming the opening through the passivation layer 305 and the optional dielectric layer 325. More specifically, at least one opening through the upper dielectric layer 340 is formed using photolithography and selective etch processes.

Still referring to FIG. 5A, a front contact 345 may be formed filling the at least one opening through the passivation layer 305 and the optional dielectric layer 325, wherein the front contact 345 is in direct contact with the emitter structure 320. In one embodiment, the front contact 345 of a solar cell consists of a set of parallel narrow finger lines and wide collector lines deposited typically at a right angle to the finger lines. The front contact 345 may be deposited with a screen printing technique. In another embodiment, the front contact 345 is provided by the application of an etched or electroformed metal pattern. The metallic material used in forming the metal pattern for the front contact 345 may include applying a metallic paste. The metallic paste may be any conductive paste, such as Al paste, Ag paste or AlAg paste. The metallic material used in forming the metal pattern for the front contact 345 may also be deposited using sputtering, thermal/e-beam evaporation or plating.

Figure 5B:
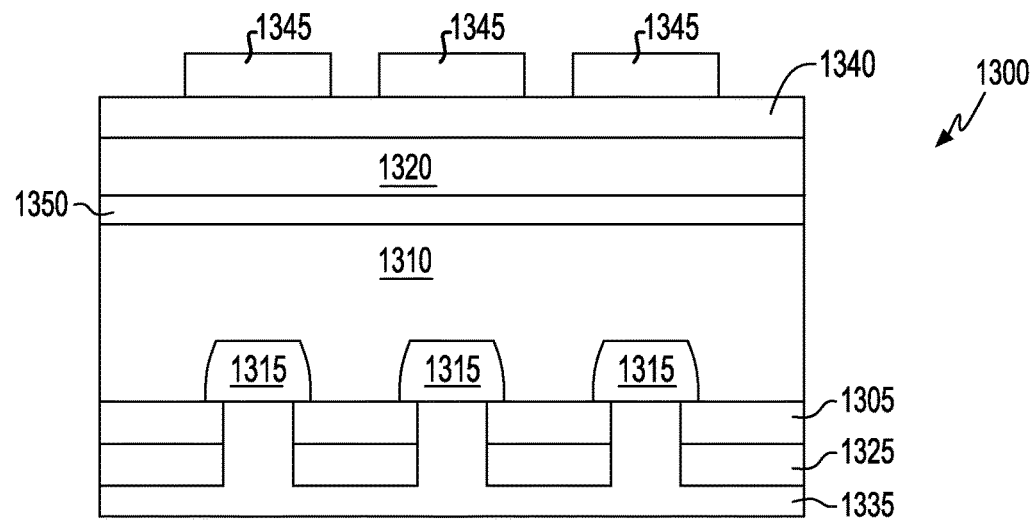
FIG. 5B is a side cross-sectional view of a photovoltaic device including a heterojunction solar cell with single crystalline silicon (c-Si) absorption layers, and an emitter structure composed of a hydrogenated amorphous silicon and deuterium containing material, wherein a transparent conductive material is present overlying the emitter structure, in accordance with one embodiment of the present disclosure.

FIG. 5B depicts one embodiment of a photovoltaic device 1300 including a heterojunction solar cell with single crystalline silicon (c-Si) absorption layer (hereafter referred to as an absorption layer 1310), and an emitter structure 1320 composed of a hydrogenated amorphous silicon and deuterium containing material, wherein a transparent conductive material layer 1340 is present overlying the emitter structure 1320. Applicants submit that the absorption layer 1310 and the emitter structure 1320 that are depicted in FIG. 5B are similar to the absorption layer 1310 and the emitter structure 1320 that are depicted in FIG. 5A. Therefore, the description of the absorption layer 310 and the emitter structure 320 in reference to FIG. 5A is applicable for the absorption layer 1310 and the emitter structure 1320 that are depicted in FIG. 5B.

In one embodiment, the emitter structure 1320 is composed of hydrogenated amorphous silicon that is doped to a conductivity that is opposite the conductivity of the absorption layer 1310. For example, when the absorption layer 1310 is doped to an n-type conductivity, the emitter structure 1320 is doped to a p-type conductivity. In another example, when the absorption layer 1310 is doped to a p-type conductivity, the emitter structure 1320 is doped to an n-type conductivity.

In the embodiment that is depicted in FIG. 5B, an intrinsic semiconductor layer 1350 is depicted between the absorption layer 1310 and the emitter structure 1320. The intrinsic semiconductor layer 1350 may be hydrogenated amorphous silicon and deuterium containing material, which may be deposited on the absorption layer 1310 prior to forming the emitter structure 1320. In some embodiments, at least one of the emitter structure 1320 and the intrinsic semiconductor layer 1350 is composed of a hydrogenated amorphous silicon and deuterium containing material. As indicated above, the presence of deuterium in the hydrogenated amorphous silicon and deuterium containing material increases the stability of the material for the emitter structure 1320 and/or intrinsic semiconductor layer 1350. The hydrogenated amorphous silicon and deuterium containing material utilized for the emitter structure 1320 and/or the intrinsic semiconductor layer 1350 may be similar in composition to the hydrogenated amorphous silicon and deuterium containing material that is utilized in the p-i-n junctions of the photovoltaic cells 50, 55, 90 that are described above with reference to FIGS. 2-4. Therefore, the composition and method of making the hydrogenated amorphous silicon and deuterium containing material that is described above with reference to FIGS. 2-4 is suitable for providing the emitter structure 1320 and/or the intrinsic semiconductor layer 1350 that are depicted in FIG. 5B.

In one embodiment, the transparent conductive material layer 1340 that is formed on the emitter structure 1320 is composed of a material that is transparent in the range of electromagnetic radiation at which photogeneration of electrons and holes occur within the photovoltaic device structure. For example, the transparent conductive material layer 1340 may be composed of a transparent conductive oxide (TCO), such as a fluorine-doped tin oxide ($SnO_2$:F), an aluminum-doped zinc oxide (ZnO:Al), or indium tin oxide. The thickness of each of the transparent conductive material layer 1340 can be from 100 nm to 3 microns, although lesser and greater thicknesses can also be employed.

Front contacts 1345 may be in direct contact with the transparent conductive material layer 1340. In one embodiment, the front contact 1345 of a solar cell consists of a set of parallel narrow finger lines and wide collector lines deposited typically at a right angle to the finger lines. The front contact 1345 may be deposited with a screen printing technique. In another embodiment, the front contact 1345 is provided by the application of an etched or electroformed metal pattern. The metallic material used in forming the metal pattern for the front contact 1345 may include applying a metallic paste. The metallic paste may be any conductive paste, such as Al paste, Ag paste or AlAg paste. The metallic material used in forming the metal pattern for the front contact 1345 may also be deposited using sputtering, thermal/e-beam evaporation or plating.

Still referring to FIG. 5B, a passivation layer 1305 is present underlying the absorption layer 1310. The passivation layer 1305 is typically intrinsic. The passivation layer 1305 serves to passivate the back surface of the absorption layer 1310, and reduce electron-hole recombination. In one embodiment, the passivation layer 1305 may be composed of a hydrogenated amorphous silicon and deuterium containing material. The hydrogenated amorphous silicon and deuterium containing material may be similar in composition to the hydrogenated amorphous silicon and deuterium containing material that utilized in the p-i-n junctions of the photovoltaic cells 50, 60, 60a, 65, 65a, 95 that are described above with reference to FIGS. 2-4. Therefore, the composition and method of making the hydrogenated amorphous silicon and deuterium containing material that is described above with reference to FIGS. 2-4 is suitable for providing the passivation layer 1305 that is depicted in FIG. 5B. As indicated above, the presence of deuterium in the hydrogenated amorphous silicon and deuterium containing material increases the stability of the material for the back surface field layer 1305, and reduces the Staebler-Wronski effect. In some embodiments, the hydrogenated amorphous silicon and deuterium containing material that is provided for the back surface field layer 1305 may further include alloying additions of germanium and carbon.

The passivation layer 1305 may have a thickness ranging from 2 nm to 1 μm. In another embodiment, the passivation layer 3105 has a thickness ranging from 5 nm to 300 nm. In one embodiment, a semiconductor substrate can provide the absorption layer 1310, and the passivation layer 1305 can be deposited onto the semiconductor substrate. For example, when the passivation layer 1305 is composed of hydrogenated amorphous silicon and deuterium containing material, a material layer of amorphous hydrogenated silicon can be deposited onto the semiconductor substrate that provides the absorption layer 1310 using plasma enhanced chemical vapor deposition (PECVD), wherein the deuterium is introduced to the amorphous hydrogenated silicon by a deuterium containing gas treatment that is applied to the amorphous hydrogenated silicon after it has been deposited.

In the embodiment that is depicted in FIG. 5B, the passivation layer 1305 is not a continuous layer across the entirety of the back surface of the absorption layer 1310. In this embodiment, localized back surface field regions 1315 are present on the back surface of the absorption layer 1310 and are contained within openings in the passivation layer 1305. Still referring to FIG. 5B, the photovoltaic device 1300 may further include an optional dielectric layer 1325 on the passivation layer 1305. The dielectric layer 1325 may be composed of amorphous hydrogenated silicon nitride or amorphous hydrogenated silicon oxide. The dielectric layer 1325 may provide further passivation and/or reflectivity to the back surface of the photovoltaic cell.

In one embodiment, forming the localized back surface field regions 1315 to the absorption layer 1310 may begin with forming the dielectric layer 1325. The dielectric layer 1325 may be formed using a deposition process, such as CVD. The dielectric layer 1325 may have a thickness ranging from 5 nm to 1 μm, with a range of 50 nm to 300 nm being more typical. In one embodiment, at least one opening may be formed through at least the passivation layer 1305, and the optional dielectric layer 1325 when present, to expose at least a portion of the back surface of the absorption layer 1310. In one embodiment, forming the at least one opening through the passivation layer 1305 and the optional dielectric layer 1325 to expose at least a portion of the back surface of the absorption layer 1310 includes forming a patterned etch mask (not shown) on the passivation layer 1305 and the optional dielectric layer 1325, and etching exposed portions of the passivation layer 1305 and the optional dielectric layer 1325 selectively to the patterned etch mask and the back surface of the absorption layer 1310.

In one embodiment, the etch process removes the exposed portions of the back surface field layer 1305 and the optional dielectric layer 1325 with an etch chemistry that is selective to the back surface of the absorption layer 1310. In one embodiment, the etch process that forms the openings is an anisotropic etch, such as reactive-ion etching (RIE), ion beam etching, plasma etching, laser ablation or a combination thereof. Following the formation of the openings that expose the back surface of the absorption layer 1310, the localized back surface field regions 1315 may be formed in the absorption layer 1310 by introducing the dopant for the localized back surface field regions 1315 through the openings into the back surface of the absorption layer 1310. For example, the dopant that provides the conductivity type of the localized back surface field regions 1315 may be introduced to the absorption layer 1310 using ion implantation or gas vapor phase deposition, and then diffused into a depth of the semiconductor substrate to provide the localized back surface field regions 1315. The localized back surface field regions 1315 are doped to the same conductivity type as the absorption layer 1310. For example, when the absorption layer 1310 is of a p-type conductivity, the localized back surface field regions 1315 are of a p-type conductivity. The interface between the high and low doped regions produces an electric field that functions as a barrier to minority carrier flow to the back surface of the absorption layer 1310. For example, an electric field that is suitable for obstructing recombination of minority carriers, e.g., electrons, may be produced by an interface between a highly doped p-type back surface field regions 1305, e.g., having a p-type dopant concentration ranging from $1 \times 10^{17}$ atoms/cm$^3$ to $5 \times 10^{20}$ atom/cm$^3$, and a p-type absorption layer 310, e.g., having a p-type dopant concentration ranging from $1 \times 10^{14}$ atoms/cm$^3$ to $1 \times 10^{18}$ atom/cm$^3$.

Following the formation of the localized back surface field regions 1315, bottom metal contacts 1335 may be formed in direct contact with the localized back surface field regions 1315 and filling the openings through the back surface field layer 1305 and the optional dielectric layer 1325. The bottom metal contacts 1335 may be blanket deposited using a physical vapor deposition (PVD) method, such as sputtering or plating. The bottom metal contacts 1335 may be composed of any conductive material, such as aluminum, and may have a thickness ranging from 100 nm to 10 micrometers, although lesser and greater thicknesses can also be employed.

In one embodiment, the localized back surface field regions 1315 may be omitted. In this embodiment, the metal contacts may be formed in direct contact with the back surface of the absorption layer 1310 via the openings etched in the passivation layer 1305 (and the optional layer 1325 if present). This embodiment is typically referred to as a "localized back contact" structure, since the metal contact 1335 is in local contact with the absorption layer 1310 (i.e. via the openings).

Figure 6:
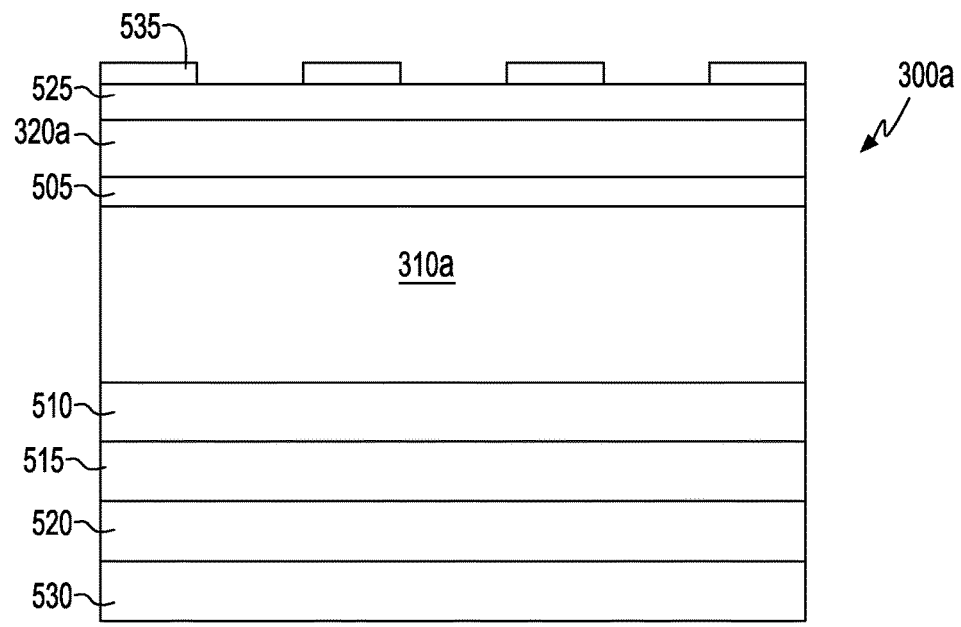
FIG. 6 is a side cross-sectional view of a photovoltaic device including a heterojunction solar cell with front and back heterojunction contacts, in accordance with one embodiment of the present disclosure.

FIG. 6 depicts one embodiment of a photovoltaic device 300a including a heterojunction solar cell with front and back heterojunction contacts. Applicants submit that the absorption layer 310a and the emitter structure 320a that are depicted in FIG. 6 are similar to the absorption layer 310 and the emitter structure 320 that are depicted in FIG. 5A. Therefore, the description of the absorption layer 310 and the emitter structure 320 in reference to FIG. 5A is applicable for the absorption layer 310a and the emitter structure 320a that are depicted in FIG. 6. In one embodiment, the emitter structure 320a is composed of hydrogenated amorphous silicon that is doped to a conductivity that is opposite the conductivity of the absorption layer 310a. For example, when the absorption layer 310a is doped to an n-type conductivity, the emitter structure 320a is doped to a p-type conductivity. In another example, when the absorption layer 310a is doped to a p-type conductivity, the emitter structure 320a is doped to an n-type conductivity. In some embodiments, the emitter structure 320a is composed of a hydrogenated amorphous silicon and deuterium containing material. As indicated above, the presence of deuterium in the hydrogenated amorphous silicon and deuterium containing material increases the stability of the material for the emitter structure 320 against temperature change and/or illumination, and as a result reduces the instability of the passivation and/or the electric field provided by the hydrogenated amorphous Si containing front and/or back contacts against temperature change and/or illumination (Staebler-Wronski effect). The upper dielectric layer 340a and the front contact 345a that are depicted in FIG. 6 are similar to the upper dielectric layer 340 and the front contact 345 that are depicted in FIG. 5A.

In the embodiment that is depicted in FIG. 6, a front intrinsic semiconductor layer 505 is depicted between the absorption layer 310a and the emitter structure 320a. The front intrinsic semiconductor layer 505 may be hydrogenated amorphous silicon and deuterium containing material, which may be deposited on the absorption layer 310a prior to forming the emitter structure 320a. A back intrinsic semiconductor layer 510 may be formed on the opposite surface of the absorption layer 310a that the front intrinsic semiconductor layer 505 is present on. The back intrinsic semiconductor layer 510 may also be composed of hydrogenated amorphous silicon and/or hydrogenated amorphous silicon and deuterium containing material. In some embodiments, the hydrogenated amorphous silicon and/or hydrogenated amorphous silicon and deuterium containing material may further include germanium and carbon in a graded or uniform concentration.

The hydrogenated amorphous silicon and deuterium containing material utilized for the front intrinsic semiconductor layer 505 and the back intrinsic semiconductor layer 510 may be similar in composition to the hydrogenated amorphous silicon and deuterium containing material that is utilized in the p-i-n junctions of the photovoltaic cells 50, 55,

90 that are described above with reference to FIGS. 2-4. Therefore, the composition and method of making the hydrogenated amorphous silicon and deuterium containing material that is described above with reference to FIGS. 2-4 is suitable for providing the front intrinsic semiconductor layer 505 and the back intrinsic semiconductor layer 510 that are depicted in FIG. 6. As indicated above, the presence of deuterium in the hydrogenated amorphous silicon and deuterium containing material increases the stability of the material for the front intrinsic semiconductor layer 505 and the back intrinsic semiconductor layer 510 against temperature change and/or illumination, and as a result reduces the instability of the passivation and/or the electric field provided by the hydrogenated amorphous Si containing front and/or back contacts, against temperature change and/or illumination (Staebler-Wronski effect).

Still referring to FIG. 6, a doped hydrogenated amorphous silicon layer 515 may be formed on the back intrinsic semiconductor layer 510. The doped hydrogenated amorphous silicon layer 515 may be composed of hydrogenated amorphous silicon and deuterium containing material, and may be doped to the same conductivity as the absorption layer 310a. For example, when the absorption layer 310a is doped to an n-type conductivity, the doped hydrogenated amorphous silicon layer 515 is doped to an n-type conductivity, and when the absorption layer 310a is doped to a p-type conductivity, the doped hydrogenated amorphous silicon layer 515 is doped to a p-type conductivity. The composition and method of making hydrogenated amorphous silicon and deuterium containing material suitable for the doped hydrogenated amorphous silicon layer 515 has been described above with reference to FIGS. 2-4.

The photovoltaic device 300a that is depicted in FIG. 6 may further include a front transparent conductive material layer 525 that is formed on the emitter structure 320a and a back transparent conductive material layer 520 that is formed on the doped hydrogenated amorphous silicon layer 515. The front and back transparent conductive material layer 525, 520 typically includes a material that is transparent in the range of electromagnetic radiation at which photogeneration of electrons and holes occur within the photovoltaic device structure. For example, each of the front and back transparent conductive material layer 525, 520 may be composed of a transparent conductive oxide (TCO), such as a fluorine-doped tin oxide ($SnO_2$:F), an aluminum-doped zinc oxide (ZnO:Al), or indium tin oxide. The thickness of each of the front and back transparent conductive material layer 525, 520 can be from 100 nm to 3 microns, although lesser and greater thicknesses can also be employed. Typically when the absorbing layer 310a is mono-crystalline or multi-crystalline Si, the thickness of the front and back transparent conductive materials are in the range of 70 nm to 100 nm to minimize light reflection from the front surface and maximize the right reflection from the back surface of the absorption layer 310a.

Front contacts 535 may be in direct contact with the front transparent conductive material layer 525, and back contacts 530 may be in direct contact with the back transparent conductive material layer 520. In one embodiment, the front contact 535 of a solar cell consists of a set of parallel narrow finger lines and wide collector lines deposited typically at a right angle to the finger lines. The front contact 535 may be deposited with a screen printing technique. In another embodiment, the front contact 535 is provided by the application of an etched or electroformed metal pattern. The metallic material used in forming the metal pattern for the front contact 535 may include applying a metallic paste. The metallic paste may be any conductive paste, such as Al paste, Ag paste or AlAg paste. The metallic material used in forming the metal pattern for the front contact 535 may also be deposited using sputtering, thermal/e-beam evaporation or plating. In one embodiment, the back contact 530 may be deposited on the back transparent conductive material layer 520 by electroplating, electroless plating, physical vapor deposition, chemical vapor deposition, vacuum evaporation, or a combination thereof. The metal for the back contact 530 may be the same composition or be a different composition than the metal for the front contact 535.

Figure 7:
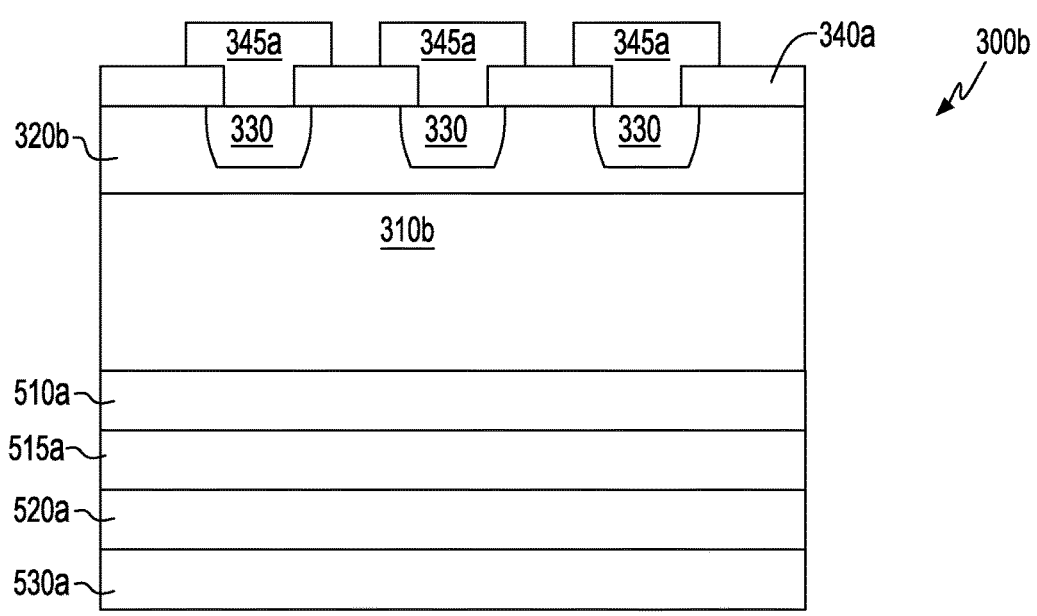
FIG. 7 is a side cross-sectional view of a photovoltaic device including a heterojunction solar cell with a dual emitter, in accordance with one embodiment of the present disclosure.

FIG. 7 depicts a photovoltaic device 300b including a solar cell device with a double emitter front structure 320b, 330, and a heterojunction back structure. The absorption layer 310b, back intrinsic semiconductor layer 510a, doped hydrogenated amorphous silicon layer 515a, back transparent conductive material layer 520a, and the back contact 530a that are depicted in FIG. 7 are similar to the absorption layer 310a, back intrinsic semiconductor layer 510, doped hydrogenated amorphous silicon layer 515, back transparent conductive material layer 520, and the back contact 530 that are depicted in FIG. 6. Therefore, the description of the absorption layer 310a, back intrinsic semiconductor layer 510, doped hydrogenated amorphous silicon layer 515, back transparent conductive material layer 520, and the back contact 530 that are depicted in FIG. 6 is suitable for the absorption layer 310b, back intrinsic semiconductor layer 510a, doped hydrogenated amorphous silicon layer 515a, back transparent conductive material layer 520a, and the back contact 530a that are depicted in FIG. 7.

The double emitter structure 320b, 330 may be formed on the face of the absorption layer 310b that is opposite the face of the absorption layer 310b that the back intrinsic semiconductor layer 510a is present on. The double emitter structure 320b, 330 has a conductivity type that is opposite the conductivity type of the absorption layer 310b. For example, in the embodiments in which the absorption layer 310b has a p-type conductivity, the double emitter structure 320b, 330 may have an n-type conductivity. In another example, in the embodiments in which the absorption layer 310b has an n-type conductivity, the double emitter structure 320b, 330 may have a p-type conductivity.

The double emitter structure 320b, 330 may include a first emitter region 320b, and a second emitter region 330. The first emitter structure 320b may be a material layer that is present on, and in direct contact with, the entire width of the absorption layer 310b. The second emitter region 330 may have the same conductivity as the first emitter structure 320b, in which the concentration of the dopant that dictates the conductivity type of the material is greater in the second emitter region 330 than in the first emitter region 320b. In one embodiment, the first emitter region 320b is a continuous layer that is present across the entire width of the absorption layer 310b, and the second emitter region 330 is composed of islands of discontinuous material that are positioned to be contacted by the subsequently formed front contacts 345a.

Each of the first and second emitter regions 320b, 330 may be composed of a crystalline semiconductor layer, such as Si, Ge, SiGe, SiC, SiGeC and combinations thereof. In another embodiment, the first and second emitter regions 320b, 330 may also be composed of a compound semiconductor, such as type III-IV semiconductors, e.g., GaAs. In a silicon containing material, examples of n-type dopants that provide the conductivity type of the first emitter region 320b and the second emitter region 330 include, but are not limited to, antimony, arsenic and phosphorous. An upper dielectric layer 340a may be present on the upper surface of the double emitter structure 320b, 330, in which openings through the upper dielectric layer 340a are aligned to the second emitter region 330. The upper dielectric layer 340a may be composed of silicon oxide, silicon nitride or a combination thereof. Openings may be present through the upper dielectric layer 340a that correspond to the second emitter region 330 of the emitter structure 320b, 330. The openings may be filled with the subsequently formed front contact 345a.

In one embodiment, forming the double emitter structure 320b, 330 may begin with depositing the first emitter region 320b on the absorption layer 310b. When the first emitter region 320b is composed of a crystalline semiconductor material, the crystalline semiconductor material may be deposited using a CVD process selected from the group consisting of atomic pressure chemical vapor deposition (APCVD), low pressure chemical vapor deposition (LP-CVD), plasma enhanced chemical vapor deposition (PECVD), metal organic chemical vapor deposition (MOCVD) and combinations thereof. The thickness of the layer that provides the first emitter region 320b may range from 2 nm to 2 µm. In another embodiment, the thickness of the layer that provides the first emitter region 320b may range from 3 nm to 500 nm.

The dopant that provides the conductivity type of the first emitter region 320b may be incorporated in the first emitter region 320b using in-situ doping during the deposition process that provides the material layer of the first emitter region 320b. In another embodiment, the dopant that provides the conductivity type of the first emitter region 320 may be incorporated in the first emitter region 320 using ion implantation following the deposition process that provides the material layer of the first emitter region 320.

The dopant that provides the conductivity type of the second emitter region 330 is implanted into the first emitter region 320b using the upper dielectric layer 340a as an implantation mask. For example, and in one embodiment, the dielectric layer 340a is formed on the first emitter region 320b, and is patterned and etched to provide openings exposing the portions of the first emitter region 320b that is implanted to provide the second emitter region 330. The upper dielectric layer 340a may be deposited using CVD, such as atomic pressure chemical vapor deposition (AP-CVD), low pressure chemical vapor deposition (LPCVD), plasma enhanced chemical vapor deposition (PECVD), metal organic chemical vapor deposition (MOCVD) or combinations thereof.

In one embodiment, at least one opening is formed through the upper dielectric layer 340 using photolithography and selective etch processes. Following the formation of the openings that expose the first emitter region 320b, the second emitter region 330 may be formed in the first emitter region 320b by introducing the dopant for the second emitter region 330 through the openings in the upper dielectric layer 340a into the exposed portions of first emitter region 320b. For example, the dopant that provides the conductivity type of the second emitter region 330 may be introduced to the first emitter region 320b using ion implantation or gas vapor phase deposition. The concentration of the dopant in the second emitter region 330 is greater than the concentration of the dopant in the first emitter region 320b. For example, in one embodiment, in which the first emitter structure 320b and the second emitter structure 330 are doped to an n-type conductivity, the dopant concentration in the first emitter structure 320b may range from $5 \times 10^{17}$ atoms/cm$^3$ to $1 \times 10^{19}$ atoms/cm$^3$ and the dopant concentration in the second emitter structure 330 may range from $1 \times 10^{18}$ atoms/cm$^3$ to $5 \times 10^{19}$ atoms/cm$^3$.

Following the formation of the second emitter region 330, a front contact 345 is formed in direct contact with the second emitter region 330 filling the openings in the upper dielectric layer 340a. In one embodiment, the front contact 345 of a solar cell consists of a set of parallel narrow finger lines and wide collector lines deposited typically at a right angle to the finger lines. The front contact 345 may be deposited with a screen printing technique. In another embodiment, the front contact 345 is provided by the application of an etched or electroformed metal pattern. The metallic material used in forming the metal pattern for the front contact 345 may include applying a metallic paste. The metallic paste may be any conductive paste, such as Al paste, Ag paste or AlAg paste. The metallic material used in forming the metal pattern for the front contact 345 may also be deposited using sputtering, thermal/e-beam evaporation or plating.

In another embodiment, an optional front intrinsic semiconductor layer (not depicted) is depicted between the absorption layer 310b and the first emitter region 320b. The front intrinsic semiconductor layer may be hydrogenated amorphous silicon and deuterium containing material, which may be deposited on the absorption layer 310b prior to forming the first emitter region 320b.

Figure 8:
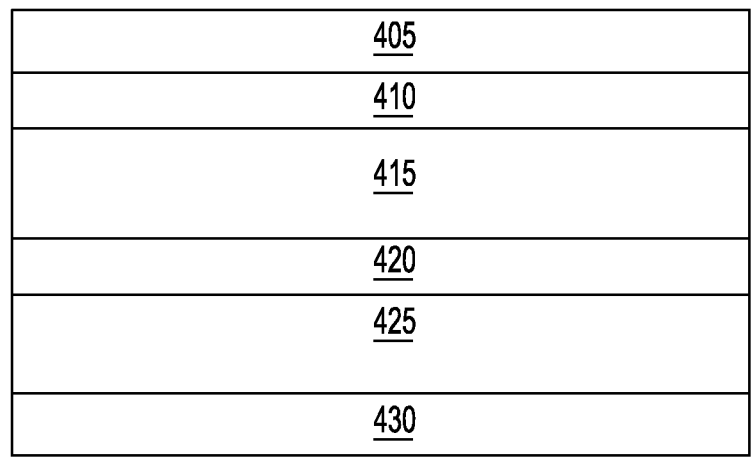
FIG. 8 is a side cross-sectional view of a tandem photovoltaic device that includes an upper cell composed of a hydrogenated amorphous silicon and deuterium containing material, and a lower cell composed of a crystalline semiconductor material, in accordance with one embodiment of the present disclosure.

FIG. 8 depicts one embodiment of a tandem photovoltaic device 400 that includes an upper cell 415 composed of hydrogenated amorphous silicon and deuterium containing material, and a lower cell 425 composed of a crystalline semiconductor material, e.g., crystalline silicon (c-Si). The upper cell 415 may include a p-type conductivity semiconductor layer, an intrinsic layer, and an n-type conductivity semiconductor layer. The upper cell 415 of the tandem photovoltaic device 400 is similar to the p-i-n junction of the single junction photovoltaic device 50 that is depicted in FIG. 2, and includes a p-type conductivity semiconductor layer, an intrinsic layer, and an n-type conductivity semiconductor layer. Therefore, the description of the composition and method of forming the p-type conductivity semiconductor layer 20, the intrinsic layer 25, and the n-type conductivity semiconductor layer 30 of the single junction photovoltaic device 400 that is depicted in FIG. 2 is suitable for the upper cell 415 that is depicted in FIG. 8. At least one of the p-type conductivity semiconductor layer, the intrinsic layer, and the n-type conductivity semiconductor layer of the upper cell 415 may be composed of a hydrogenated amorphous silicon and deuterium containing material with optional additions of carbon and germanium. The tandem photovoltaic device 400 may further include a substrate 405 and transparent conductive material layer 410, which are similar to the substrate 5 and the transparent conductive material layer 15 of the single junction photovoltaic device 50 that is depicted in FIG. 2.

In one embodiment, an intermediate tunneling layer 420 may be present between the upper cell 415 and the lower cell 425. The role of the optional tunneling layer is to enhance the tunneling of the carriers at the $p^+/n^+$ tunneling junction formed at the interface between the top cell and the bottom cell. The tunneling layer 420 may be composed of a transparent conductive material such as a transparent conductive oxide. The tunneling layer 420 may have a thickness ranging from 5 nm to 15 nm, although thinner or thicker tunneling layers may be also used.

The lower cell 425 may include an emitter structure, and an absorption layer. The emitter structure and the absorption lower cell 425 of the tandem photovoltaic device 400 is similar to the emitter structure 320, 330 and the absorption layer 310 of the heterojunction solar cell with single crystalline silicon (c-Si) absorption layer that are depicted in FIG. 2. In one embodiment, the emitter structure 320, 330 and the absorption layer 310 are composed of a crystalline silicon material, such as single crystal silicon. Therefore, the description of the composition and method of forming the absorption layer 310 and the emitter structure 320, 330 of the heterojunction solar cell that is depicted in FIG. 5A is suitable for the lower cell 425 of the tandem photovoltaic device 400 that is depicted in FIG. 8.

The tandem photovoltaic device 400 may further include a back contact structure 430 that is similar to the back contact metallization structure 35 of the single junction photovoltaic device 50 that is described above with reference to FIG. 2.

The hydrogenated amorphous silicon and deuterium containing material has a higher bandgap, e.g., 1.7 eV, than crystalline silicon, e.g., 1.1 eV. Therefore, hydrogenated amorphous silicon and deuterium containing material absorbs the visible part of the solar spectrum more strongly than the infrared portion of the spectrum. Therefore, the top cell 415 of the tandem photovoltaic device 400 that is composed of the hydrogenated amorphous silicon and deuterium containing material absorbs the visible light, and the bottom cell 425 of the tandem photovoltaic device 400 that is composed of the crystalline silicon absorbs the infrared part of the spectrum for the bottom cell 425.

The following examples are provided to further illustrate some embodiments of the present disclose and to demonstrate some advantages that arise therefrom. More specifically, the following examples demonstrate the effectiveness of the present method to improve the stability of hydrogenated amorphous silicon passivation against thermal cycling and illumination. It is not intended that the present disclosure be limited to the specific examples disclosed.

EXAMPLE 1

Passivation Degradation at Greater than Room Temperature

Figure 9:
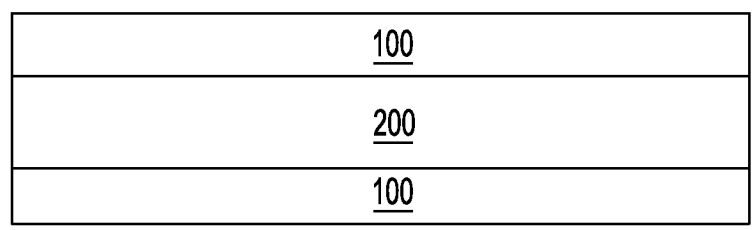
FIG. 9 is a side cross-sectional view of a crystalline silicon (c-Si) wafer with a passivation layer of hydrogenated amorphous silicon (α-Si:H) on both sides of the c-Si wafer, in accordance with one embodiment of the present disclosure.

A deuterium anneal at a pressure of about 20 atm, and at temperatures of 200° C. and 350° C., was applied to a 300 μm thick n-type crystalline silicon (c-Si) wafer 200 with 120 nm thick passivation layers of hydrogenated amorphous silicon 100 on both sides of the crystalline silicon wafer 200, as depicted in FIG. 9. The sample treated with the deuterium anneal is hereafter referred to as the "deuterium anneal sample". A comparative sample was also provided, in which a conventional forming gas anneal was applied to a 300 μm thick n-type crystalline silicon wafer with 120 nm thick passivation layers of hydrogenated amorphous silicon on both sides of the n-type crystalline silicon (c-Si) wafer. The forming gas anneal included a 20:1 $N_2/H_2$ gas ambient. The comparative sample treated with the forming gas anneal is hereafter referred to as the "forming gas anneal sample". Electrical properties were then measured from the deuterium anneal sample and the forming gas anneal sample.

Figure 10:
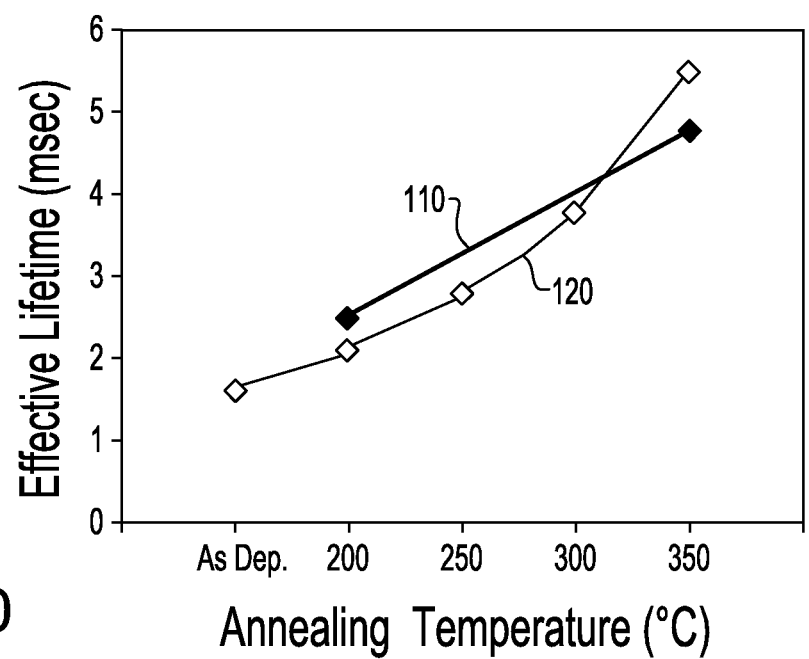
FIG. 10 is a plot of effective carrier lifetime vs. annealing temperature for a photovoltaic device including a hydrogenated amorphous silicon layer that has been treated with a deuterium gas anneal having the structure depicted in FIG. 9, and a photovoltaic device including hydrogenated amorphous silicon treated with a forming gas anneal sample having the structure depicted in FIG. 9.

FIG. 10 is a plot depicting the effective carrier lifetime measured in n-type crystalline silicon (c-Si) wafer vs. annealing temperature for the deuterium anneal sample and the forming gas anneal sample. The plot identified by reference number 110 is the effective minority carrier lifetime measured from deuterium anneal samples, and plot identified by reference number 120 is the effective minority carrier lifetime measured from the forming gas anneal samples. FIG. 10 represents the effective carrier lifetime measured from the deuterium and forming gas anneal samples immediately after annealing. FIG. 10 illustrates that the pas sivation quality immediately after annealing in the deuterium gas anneal sample 110 is comparable with the passivation quality in the forming gas anneal sample 120 that are formed using the same temperatures and pressures.

Figure 11:
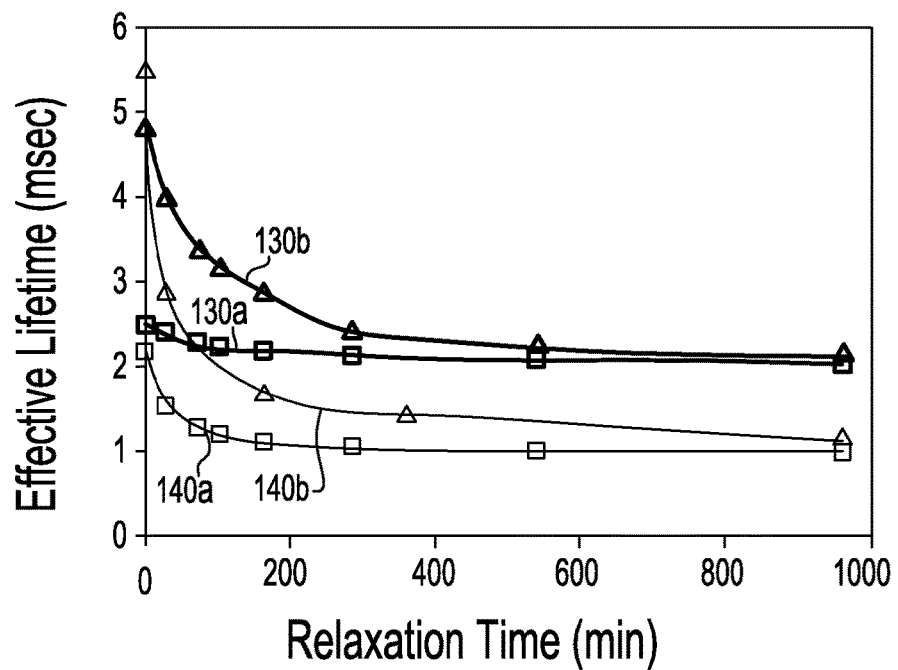
FIG. 11 is a plot of the effective minority carrier lifetime vs. annealing time at 100° C. for a photovoltaic device including a hydrogenated amorphous silicon layer that has been treated with a deuterium gas anneal having the structure depicted in FIG. 10, and a photovoltaic device including hydrogenated amorphous silicon treated with a forming gas anneal sample having the structure depicted in FIG. 10.

The samples, i.e., deuterium anneal sample and forming gas anneal sample, were then treated with an additional annealing step at 100° C. to simulate degradation of the passivation quality with increasing time. By annealing the deuterium gas sample and forming gas anneal sample at 100° C., degradation of the passivation quality was accelerated when compared to degradation of the passivation quality of the deuterium gas sample and forming gas anneal sample at room temperature 20° C. to 25° C. FIG. 11 is a plot of the effective minority carrier lifetime (milliseconds) measured in the n-type crystalline silicon (c-Si) wafer vs. annealing time (minutes) at 100° C. for the deuterium anneal sample and the forming gas anneal sample. The time period of annealing at 100° C. after the deuterium gas anneal or forming gas anneal is referred to as relaxation time.

The plot identified by reference number 130a is the effective minority carrier lifetime measured from deuterium samples with the structure depicted in FIG. 11 that were annealed at 200° C. ("deuterium 200° C. anneal sample"), and the plot identified by reference number 130b is the effective minority carrier lifetime measured from deuterium samples with the structure depicted in FIG. 9 that were annealed at 350° C. ("deuterium 350° C. anneal sample"). The plot identified by reference number 140a is the effective minority carrier lifetime measured from forming gas samples with the structure depicted in FIG. 11 that were annealed at 200° C. ("forming gas 200° C. anneal sample"), and the plot identified by reference number 140b is the effective minority carrier lifetime measured from forming gas samples with the structure depicted in FIG. 11 that were annealed at 350° C. ("forming gas 350° C. anneal sample").

As illustrated by the plots 130a, 130b, 140a, 140b in FIG. 11 for the effective minority carrier lifetime of the deuterium 200° C. anneal sample and the deuterium 350° C. anneal sample, in comparison to the effective minority carrier lifetime of the forming gas 200° C. anneal sample, and the forming gas 350° C. anneal sample, the degradation of the passivation quality after relaxation time, i.e., annealing at 100° C., was lower for the deuterium 200° C. anneal sample and the deuterium 350° C. anneal sample. By lower degradation of the passivation quality it is meant that with increasing relaxation time, the deuterium anneal samples had greater effective carrier lifetime than the forming gas anneal samples that were treated at the same temperature.

EXAMPLE 2

Passivation Degradation in Response to Light Illumination

A deuterium anneal at a pressure of about 20 atm, and at temperatures of 200° C., was applied to a 300 μm thick n-type crystalline silicon (c-Si) wafer with 120 nm thick passivation layers of hydrogenated amorphous silicon on both sides of the n-type crystalline silicon wafer, as depicted in FIG. 7. The sample treated with the deuterium anneal is hereafter referred to as the "deuterium anneal sample". A comparative sample was also provided, in which a conventional forming gas anneal at 200° C. was applied to a 300 μm thick n-type crystalline silicon wafer with 120 nm thick passivation layers of hydrogenated amorphous silicon on both sides of the n-type crystalline silicon wafer. The forming gas anneal included a 20:1 $N_2/H_2$ gas ambient. The comparative sample treated with the forming gas anneal is hereafter referred to as the "forming gas anneal sample".

The effective minority carrier lifetime in n-type crystalline silicon wafer was then measured from the deuterium anneal sample and the forming gas anneal sample under light illumination with an intensity of ~5 suns as a function of time. The samples, i.e., deuterium anneal sample and the forming gas anneal sample, were mounted on a heat sink connected to a radiator for liquid cooling and the temperature of the samples was monitored to assure the samples, i.e., deuterium anneal sample and the forming gas anneal sample, remained at room temperature (20° C. to 25° C.) during light illumination. The results of the light illumination were recorded.

Figure 12:
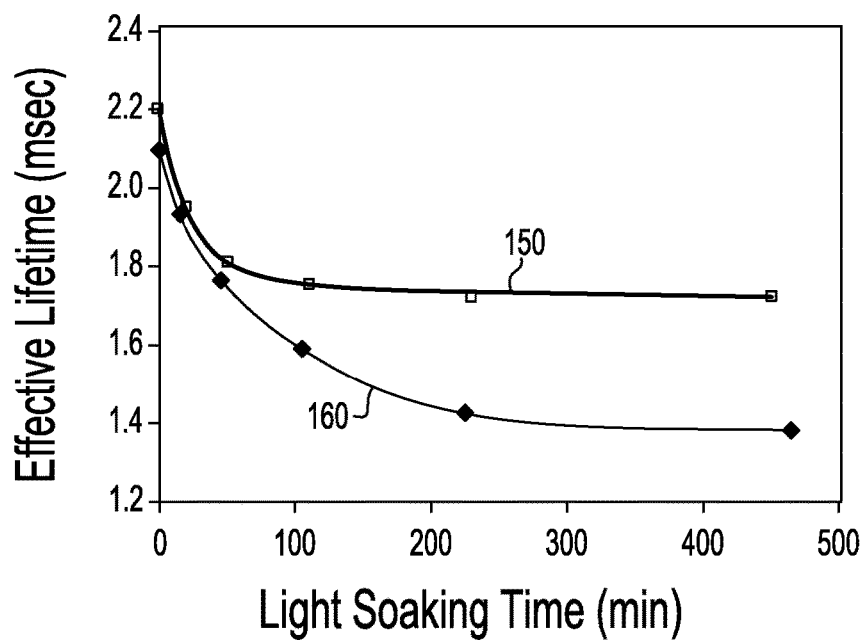
FIG. 12 is a plot of the effective minority carrier lifetime vs. time under a light intensity of approximately 5 suns at room temperature for a photovoltaic device including a hydrogenated amorphous silicon layer that has been treated with a deuterium gas anneal having the structure depicted in FIG. 9, and a photovoltaic device including hydrogenated amorphous silicon treated with a forming gas anneal sample having the structure depicted in FIG. 9.

FIG. 12 is a plot of the effective minority carrier lifetime (milliseconds) measured in n-type crystalline silicon (c-Si) vs. time (minutes) under a light intensity of ~5 suns at room temperature (20° C. to 25° C.) for a forming gas anneal sample and a deuterium gas anneal sample each being previously annealed at 200° C. The plot identified by reference number 150 is the effective minority carrier lifetime measured from deuterium gas anneal samples that were annealed at 200° C. The plot identified by reference number 160 is the effective minority carrier lifetime measured from forming gas anneal samples that were annealed at 200° C. The degradation of minority carrier lifetime in the n-type crystalline silicon wafer under illumination was lower for the deuterium gas anneal samples than the forming gas anneal samples indicating a more stable hydrogenated amorphous silicon passivation.

EXAMPLE 3

Secondary Ion Mass Spectrometry

A deuterium anneal at a pressure of about 20 atm, and at temperatures of 200° C. and 350° C., was applied to a 300 μm thick n-type crystalline silicon (c-Si) wafer with 120 nm thick passivation layers of hydrogenated amorphous silicon on both sides of the c-Si wafer, as depicted in FIG. 9. The sample treated with the deuterium anneal at 200° C. is hereafter referred to as the "deuterium 200° C. anneal sample". The sample treated with the deuterium anneal at 350° C. is hereafter referred to as the "deuterium 350° C. anneal sample". SIMS depth profiles were then measured from the deuterium anneal sample and the forming gas anneal sample.

Figure 13A:
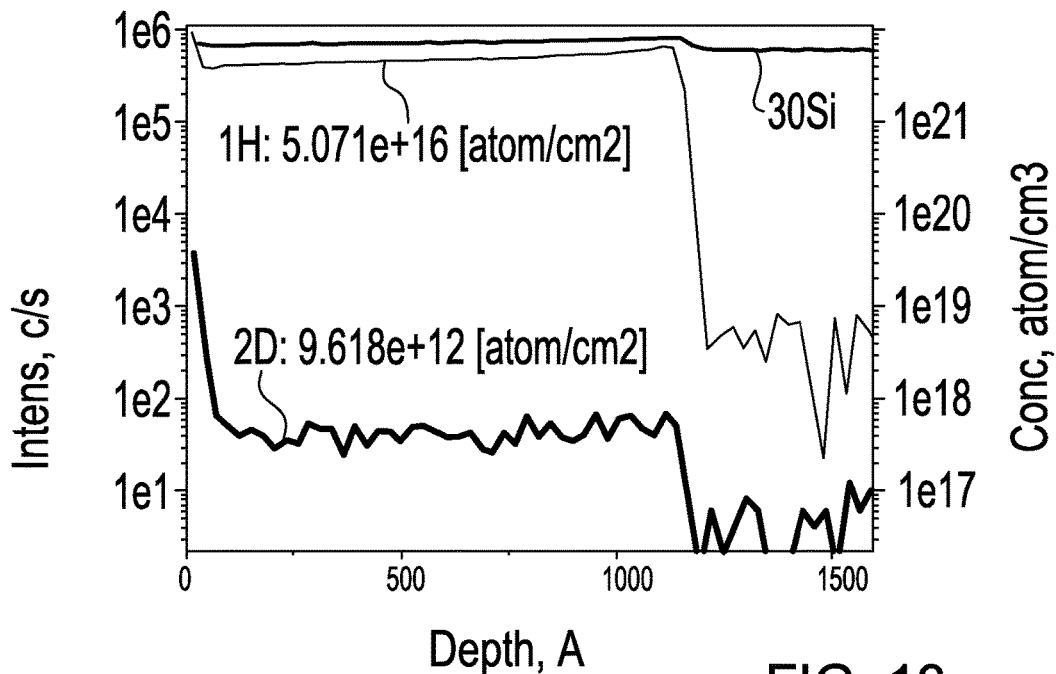
FIGS. 13(a) and 13(b) are SIMS depth profiles of hydrogen and deuterium in a-Si:H and a-Si:H/c-Si interface for the test samples described in Examples 1 and 2 after HPD treatment at (a) 200° C. and (b) 350° C.
Figure 13B:
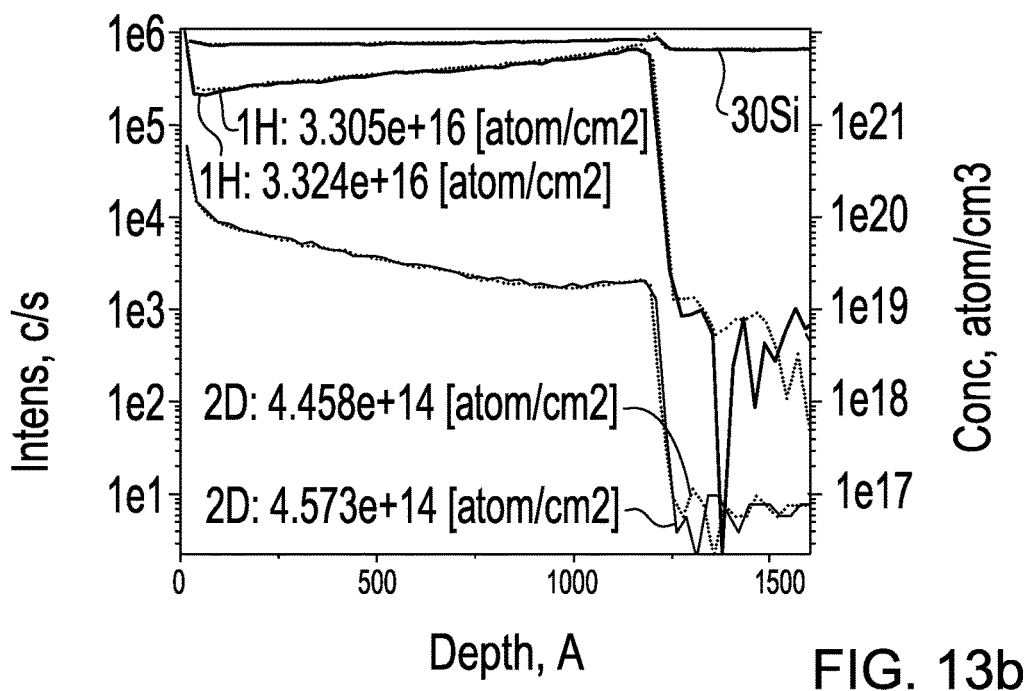

FIG. 13(a) is the depth profile measured from the deuterium 200° C. anneal sample, and FIG. 13(b) is the depth profile measured from the deuterium 350° C. anneal sample. The deuterium (D)/ hydrogen (H) ratio (D/H ratio) in hydrogenated amorphous silicon films treated with high-pressure deuterium gas anneal at 200° C. (FIGS. 13(a)) and 350° C. (FIG. 13(b)) were 0.019% and 1.36%, respectively. Note that a D/H ratio of 0.019% corresponds to a deuterium density of ~$10^{17}$ cm$^{-3}$ (assuming hydrogen (H)/ silicon (Si) ratio of ~10% in α-Si:H and an atomic density of $5 \times 10^{22}$ cm$^{-3}$ for Si), an order of magnitude above the density of dangling bonds in device quality hydrogenated amorphous silicon. Since the effective lifetime of the samples treated with deuterium gas anneal at 200° C. and 350° C. are equal at thermal equilibrium (after relaxation), as plotted in FIG. 11, the excess amount of deuterium incorporated in hydrogenated amorphous silicon by deuterium gas anneal at 350° C. did not contribute to the thermal equilibration of weak bonds and dangling bonds in hydrogenated amorphous silicon.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A photovoltaic device comprising:
   a single crystalline semiconductor absorption layer of a first conductivity type having a first surface and a second surface that is opposite said first surface, said single crystalline semiconductor absorption layer having at least one local back field surface region of said first conductivity type located beneath said first surface of said crystalline semiconductor absorption layer;
   an emitter layer comprising a semiconductor material having a second conductivity type that is different from said first conductivity type and directly contacting said second surface of said crystalline semiconductor absorption layer;
   passivation layer portions located on said first surface of said single crystalline semiconductor absorption layer, wherein each passivation layer portion is separated by a gap and said gap exposes a surface of said at least one local back field surface region, and wherein at least one of said emitter layer and said passivation layer portions comprises a hydrogenated amorphous silicon containing material, wherein deuterium is present throughout an entirety of said hydrogenated amorphous silicon containing material.

2. The photovoltaic device of claim 1, wherein both said emitter layer and said passivation layer portions comprise said hydrogenated amorphous silicon containing material.

3. The photovoltaic device of claim 1, wherein said passivation layer is an intrinsic material.

4. The photovoltaic device of claim 1, wherein only said passivation layer portions comprise said hydrogenated amorphous silicon containing material.

5. The photovoltaic device of claim 1, wherein only said emitter layer comprises said hydrogenated amorphous silicon containing material.

6. The photovoltaic device of claim 1, wherein said first conductivity type is p-type and said second conductivity type is n-type.

7. The photovoltaic device of claim 1, wherein said first conductivity type is n-type and said second conductivity type is p-type.

8. The photovoltaic device of claim 1, wherein said absorption layer has a band gap from 0.1 eV to 7.0 eV.

9. The photovoltaic device of claim 1, further comprising a dielectric layer present on the passivation layer.

10. The photovoltaic device of claim 9, wherein said dielectric layer is composed of amorphous silicon nitride or amorphous hydrogenated silicon oxide.

11. The photovoltaic device of claim 1, wherein said local back field surface region has a p-type dopant concentration from $1 \times 10^{17}$ atoms/cm$^3$ to $5 \times 10^{20}$ atoms/cm$^3$, and said absorption layer has a p-type dopant concentration from $1 \times 10^{14}$ atoms/cm$^3$ to $5 \times 10^{18}$ atoms/cm$^3$.

12. The photovoltaic device of claim 1, further comprising a bottom metal contact in direct contact with said local back field surface region.

13. The photovoltaic device of claim 1, wherein said emitter layer is composed of a crystalline semiconductor material.

14. The photovoltaic device of claim 1, further comprising a dielectric layer located on a physically exposed surface of said emitter layer.

15. The photovoltaic device of claim 14, wherein said dielectric layer contains openings that expose a portion of the emitter layer, and wherein each opening is contains a front contact.

* * * * *